5,798,784

United States Patent [19]
Nonaka et al.

[11] Patent Number: 5,798,784
[45] Date of Patent: Aug. 25, 1998

[54] LASER DRAWING APPARATUS FEATURING A BEAM SEPARATOR SUPPORTED BY AN ADJUSTING MEANS SWINGABLE ABOUT A ROTATING SHAFT

[75] Inventors: Jun Nonaka; Shuichi Shimizu; Satoru Kobayashi; Takashi Iizuka, all of Tokyo, Japan

[73] Assignee: Asahi Kogaku Kogyo Kabushiki Kaisha, Tokyo, Japan

[21] Appl. No.: 664,847

[22] Filed: Jun. 17, 1996

Related U.S. Application Data

[63] Continuation of Ser. No. 279,746, Jul. 22, 1994, abandoned.

[30] Foreign Application Priority Data

Jul. 22, 1993 [JP] Japan .................................. 5-181724

[51] Int. Cl.$^6$ ............................ B41J 2/47; G01D 15/14; G02B 26/00; G02B 27/00
[52] U.S. Cl. ........................ 347/243; 347/245; 347/239; 347/242; 359/204; 399/5
[58] Field of Search .......................... 347/241, 263, 347/245, 244, 239, 242, 243; 359/196, 204, 496, 246; 399/5, 6

[56] References Cited

U.S. PATENT DOCUMENTS

| | | | |
|---|---|---|---|
| 4,896,169 | 1/1990 | Kuwabara et al. | 347/241 |
| 5,296,958 | 3/1994 | Roddy et al. | 347/244 |

*Primary Examiner*—N. Le
*Assistant Examiner*—Raquel Yvette Gordon
*Attorney, Agent, or Firm*—Kane,Dalsimer,Sullivan, Kurucz, Levy, Eisele and Richard, LLP

[57] ABSTRACT

A laser drawing apparatus is provided including, a first beam splitting element for splitting laser light emitted from a laser source into a plurality of beams, a second beam splitting element for splitting the beams split by the first beam splitting element into a plurality of groups of drawing beams, optical modulators which provide separate ON/OFF drawing data to the respective split drawing beams split by the second splitting element, a beam combining element for combining the split drawing beams to which the ON/OFF drawing data has been provided, and a beam scanning element for scanning a drawing surface on which an image is to be formed with the combined drawing beams.

24 Claims, 21 Drawing Sheets

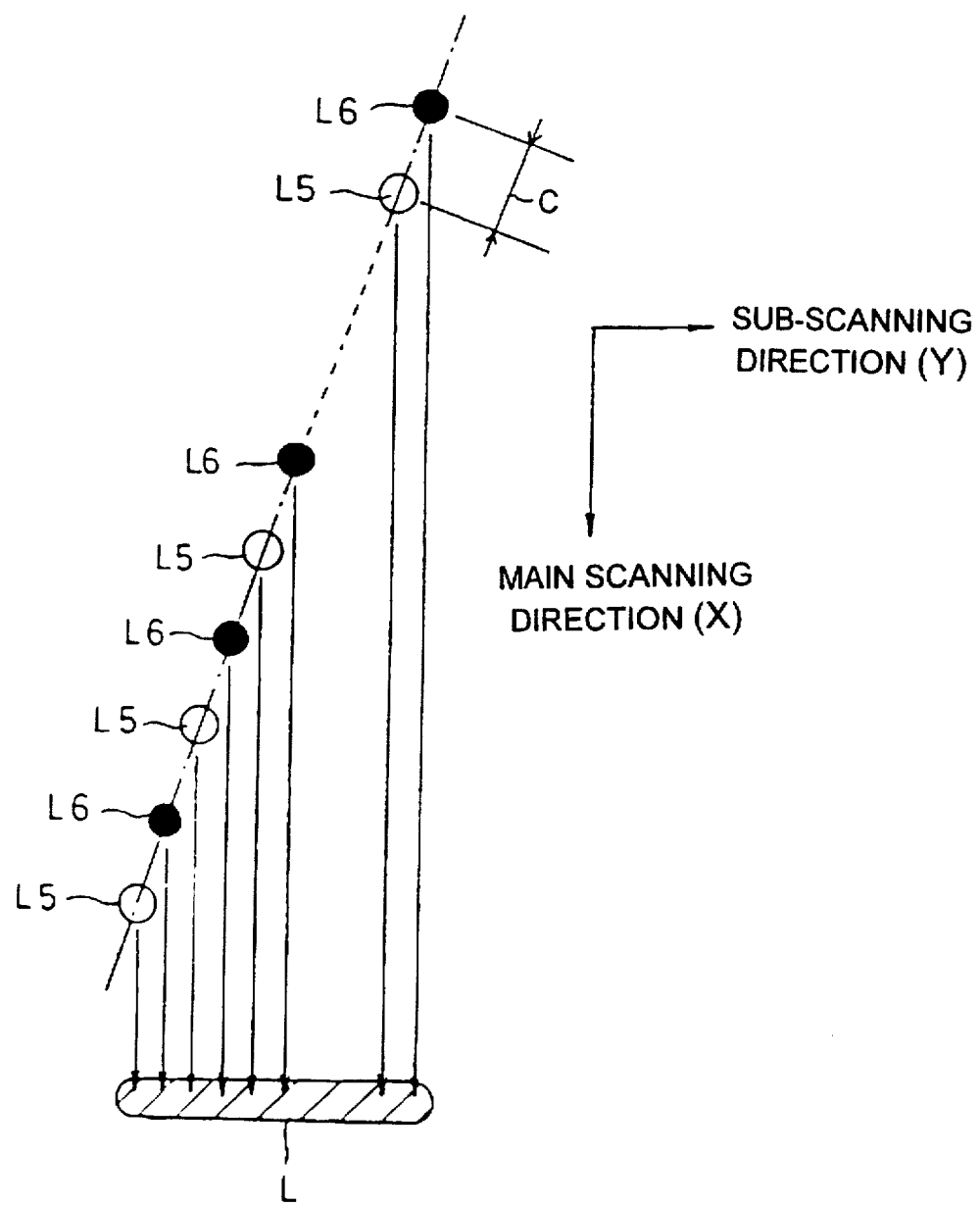

LASER DRAWING APPARATUS FEATURING A BEAM SEPARATOR SUPPORTED BY AN ADJUSTING MEANS SWINGABLE ABOUT A ROTATING SHAFT

This application is a continuation of application Ser. No. 08/279,746, filed on Jul. 22, 1994, now abandoned.

BACKGROUND OF THE INVENTION

1. Field of the Invention

The present invention relates to a laser drawing apparatus which is adapted, for example, to form a predetermined pattern of circuit on a circuit board.

2. Description of the Related Art

In a known method of forming a circuit pattern on a circuit board (i.e., substrate), a photopolymer or the like is uniformly applied to the substrate coated with a thin film layer of electrically conductive metal, such as copper. Thereafter, the substrate is illuminated with ultraviolet light, for example, while masking the substrate with an exposing and printing photomask (photomask film) having a predetermined shape, so that a circuit pattern corresponding to the photomask is formed on the substrate. The exposed photopolymer on the substrate is dissolved by a solvent and is subjected to a predetermined treatment by chemicals in liquid state so that the exposed conductive metal is corroded. No corrosion occurs at the portion of the substrate on which the non-exposed photopolymer layer remains. Hence, the same circuit pattern as the photomask pattern is formed on the substrate.

However, in the known manufacturing method as mentioned above, it requires a long time and a number of processes to examine the photomask. Furthermore, it is necessary not only to create the environment for the photomask in which temperature and humidity are kept constant to thereby prevent the photomask from being thermally contracted or expanded, but also to protect the photomask from dust or possible damage. Consequently, maintenance of the photomask is troublesome.

It is also known to directly draw the circuit pattern on the substrate, using a scanning laser beam with which the substrate is scanned with the help of a polygonal mirror or the like, without using an exposing and printing photomask. In this method, the above-mentioned drawbacks in the manufacturing method in which the photomask is employed can be eliminated, but the drawing speed is unacceptably slow.

SUMMARY OF THE INVENTION

The primary object of the present invention is to provide a laser drawing apparatus which does not use an exposing and printing photomask, in which the drawing speed can be increased.

To achieve the object mentioned above, according to the present invention, there is provided a first beam splitting means for splitting laser light emitted from a laser source into a plurality of beams, a second beam splitting means for splitting the beams split by the first beam splitting means into a plurality of groups of drawing beams, optical modulators which provide separate ON/OFF drawing data to the respective split drawing beams split by the second splitting means, a beam combining means for combining the split drawing beams to which the ON/OFF drawing data has been provided, and a beam scanning means for scanning a drawing surface on which an image is to be formed with the combined drawing beams.

With this arrangement, since no photomask is used, it is possible to reduce the number of steps necessary for inspecting the photomask and curtail the time involved thereby. Hence, the drawing speed can be extremely increased.

The second beam splitting means could comprise of a pair of beam splitters which split and align the beams split by the first splitting means to thereby obtain a plurality of drawing beams that are contained in a common plane. The beam combining means combines the beams that have been split and aligned by the second beam splitters so that said beams are arranged in an alternating manner along a line.

The second beam splitting means could comprise of at least one beam separator which separates beams split by the first beam splitting means into a plurality of groups of drawing beams, the groups of drawing beams being aligned in said common plane. The beam separator is supported by an adjusting means in such a manner that the beam separator is swingable about an axis extending parallel to the drawing beams in said common plane.

The beam combining means could comprise of a polarization beam splitter which combines the two groups of drawing beams in a plane, one of the groups of drawing beams being passed through the polarization beam splitter and the other of the groups of drawing beams being reflected by the polarization beam splitter, and means for moving the polarization beam splitter in a direction normal to one of the groups of drawing beams which pass the polarization beam splitter so that the two groups of drawing beams align in a plane.

According to another aspect of the present invention, there is provided a first beam splitting means for splitting laser light emitted from a laser source into a plurality of beams, a second beam splitting means for splitting said beams split by the first beam splitting means into a plurality of groups of drawing beams, a beam combining means for combining the split drawing beams that have been split and aligned by the second beam splitters so that the beams are arranged in an alternating manner along a line, and a beam scanning means for scanning a drawing surface on which an image is to be formed with the combined drawing beams.

BRIEF DESCRIPTION OF THE DRAWINGS

The invention will be described below in detail with reference to the accompanying drawings.

DESCRIPTION OF THE PREFERRED EMBODIMENT

Figure 1:
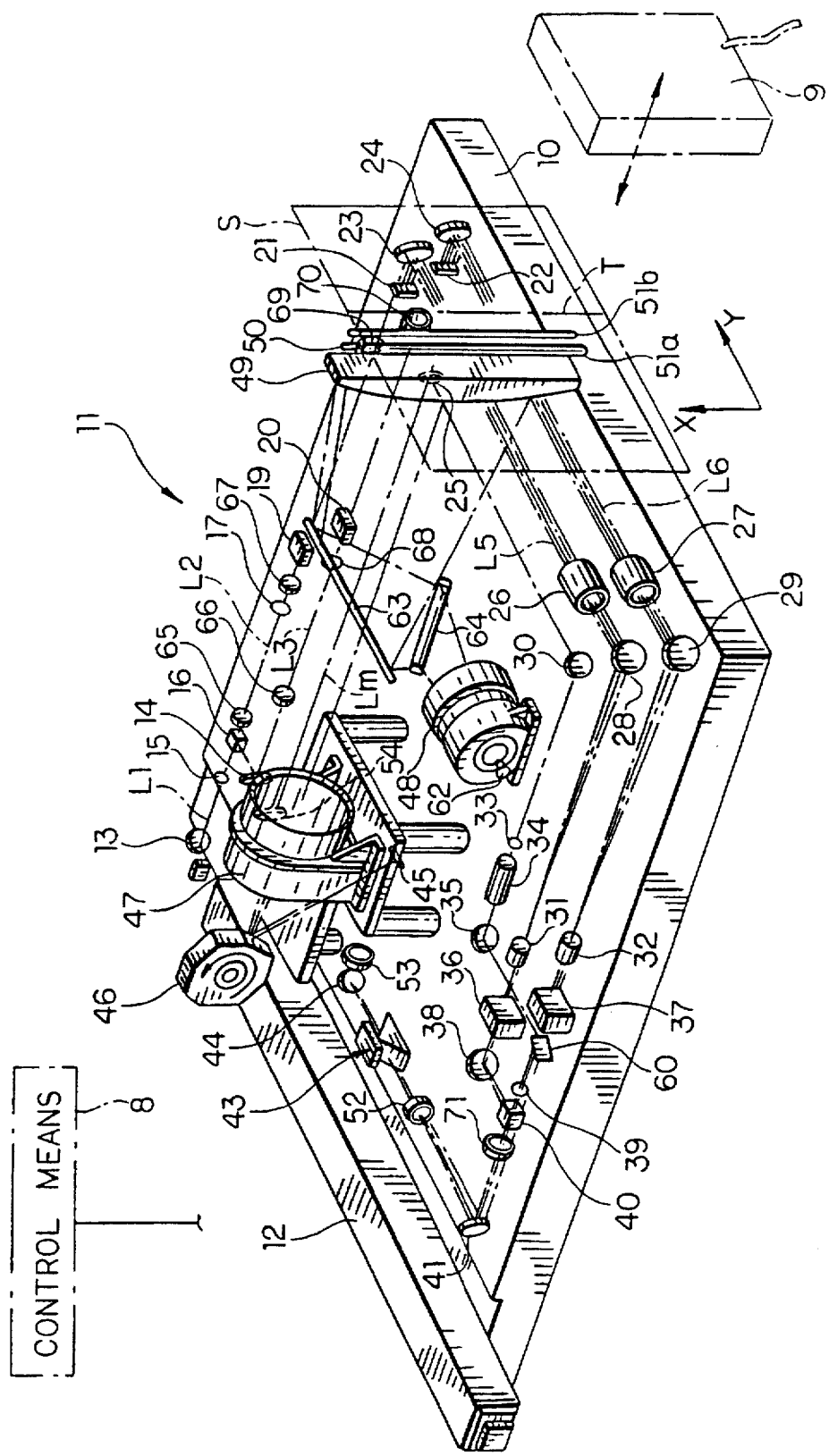
FIG. 1 is a perspective view of a laser drawing apparatus according to the present invention.
Figure 2:
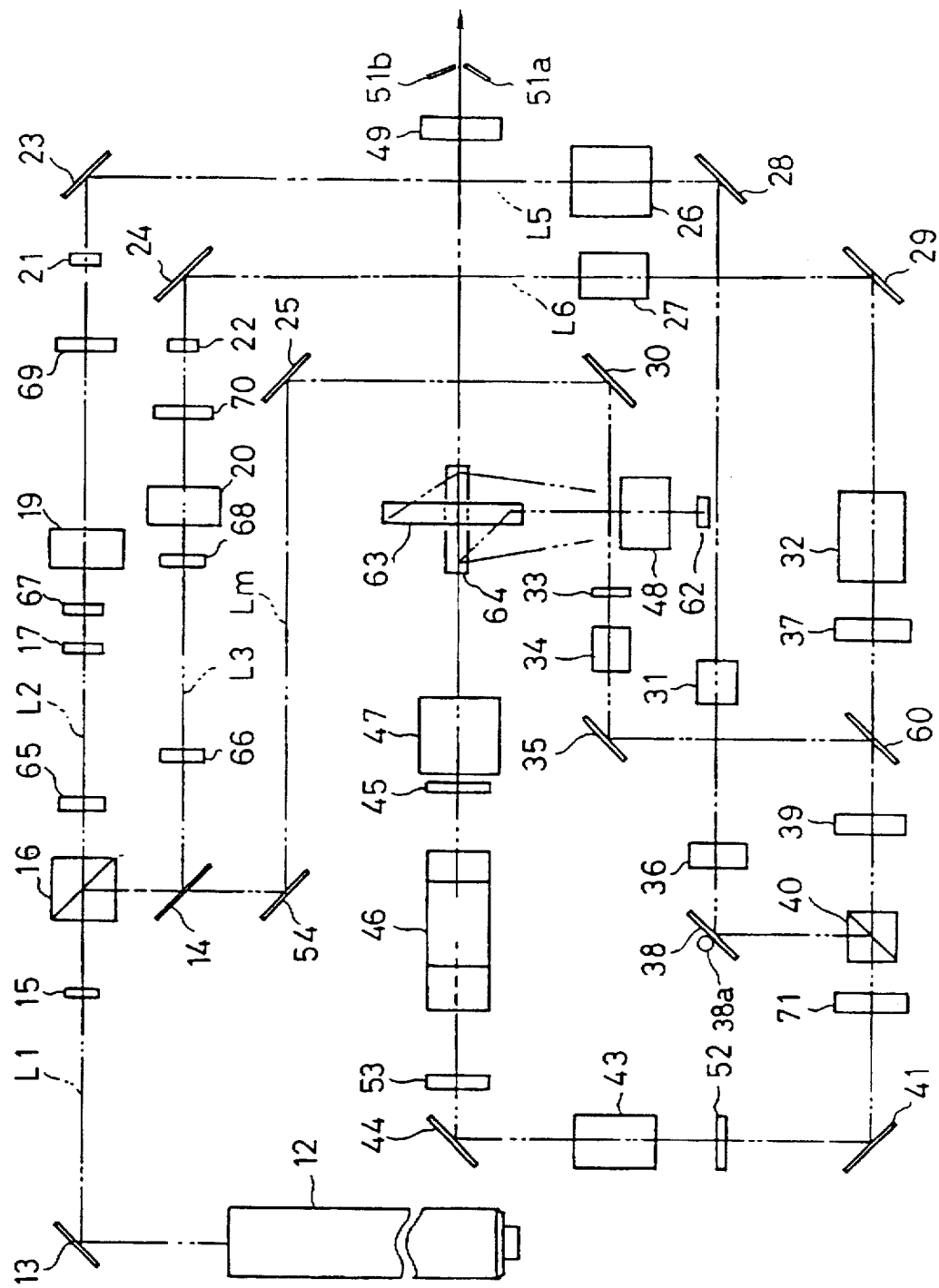
FIG. 2 is a schematic plan view of a laser drawing apparatus shown in FIG. 1.
Figure 3:
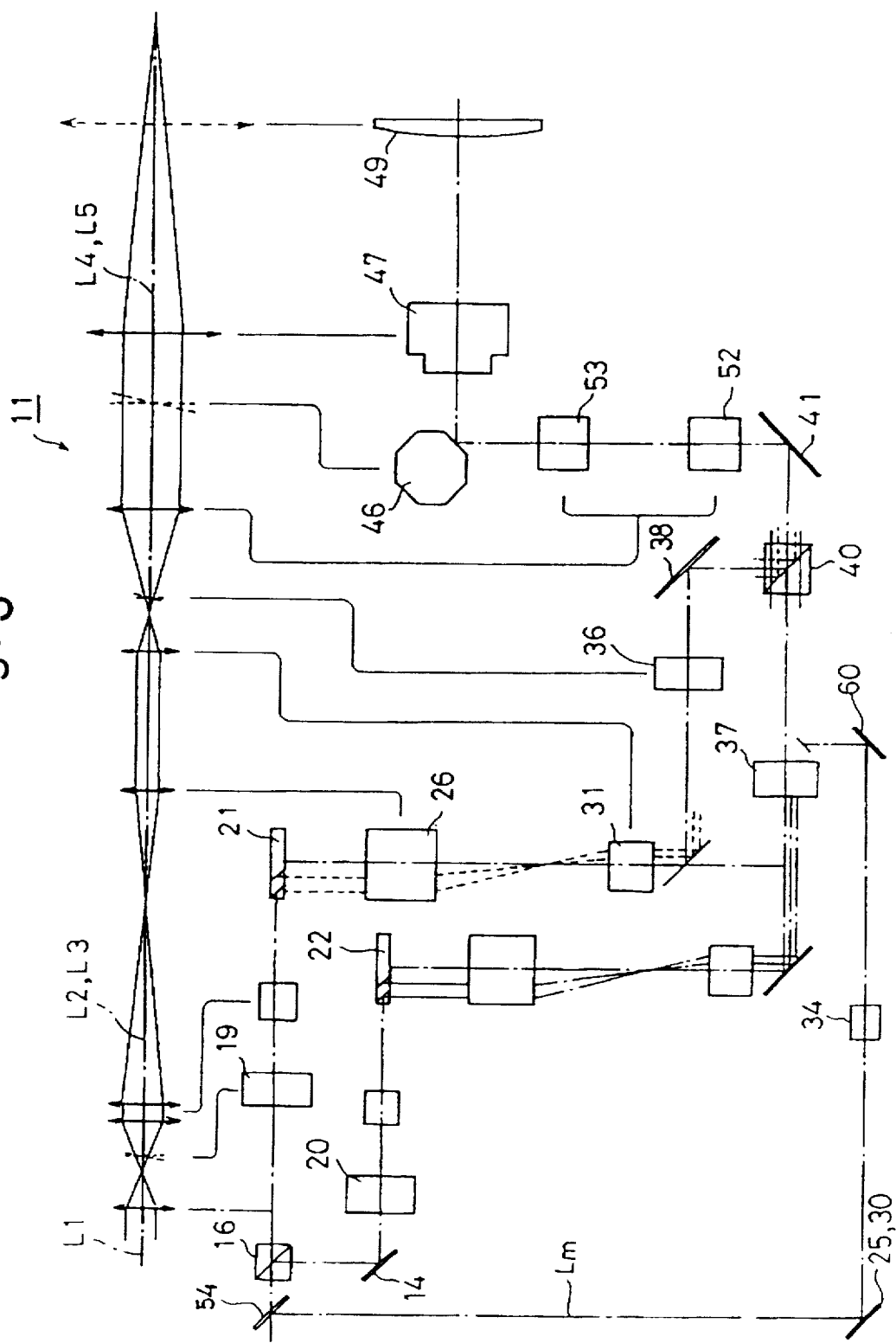
FIG. 3 is a schematic plan view of main components of a laser drawing apparatus shown in FIG. 1.

FIGS. 1 and 2 are a perspective view and a schematic plan view of a laser drawing apparatus to which the present invention is applied, respectively, and FIG. 3 is a schematic plan view of main components of a laser drawing apparatus shown in FIGS. 1 and 2.

Figure 8:
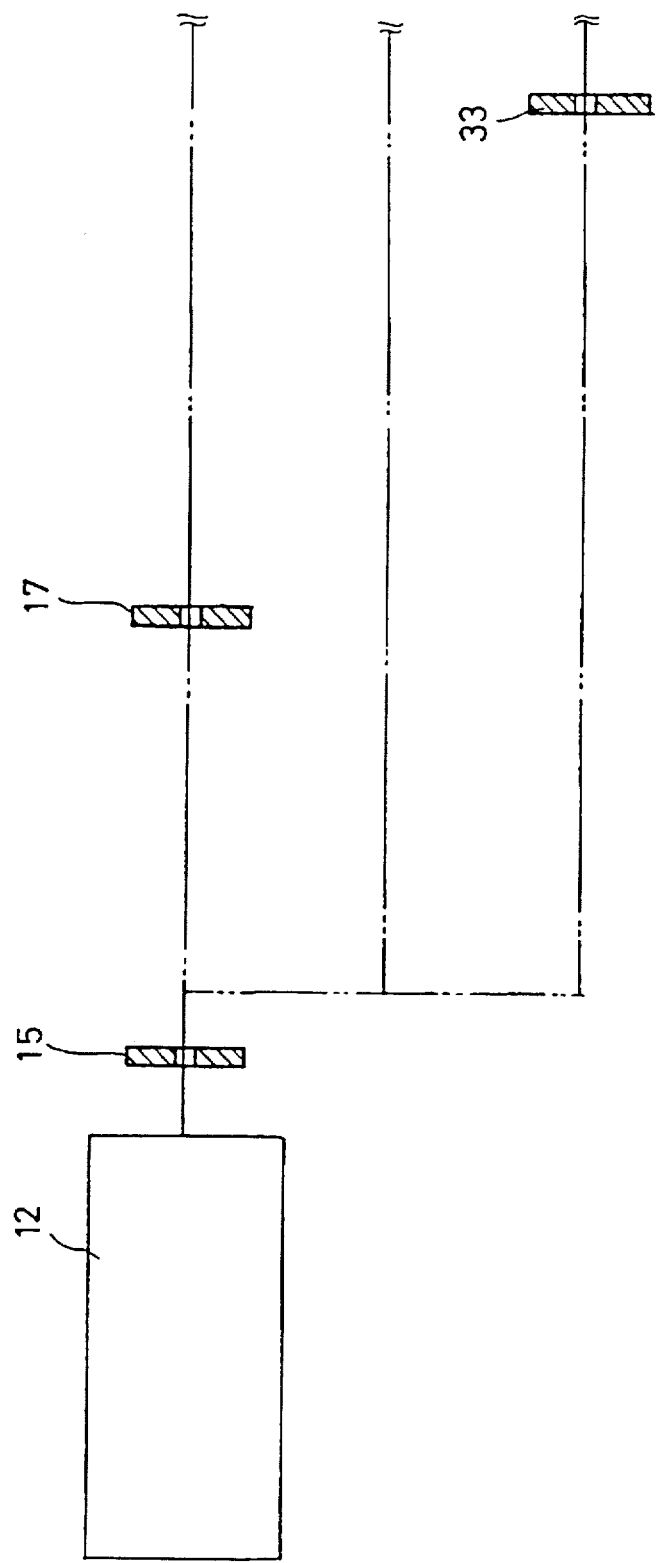
FIG. 8 is a schematic view of an adjustment target which is adapted to confirm the position of a group of drawing beams emitted from an argon laser (Ar laser)

The laser drawing apparatus 11 includes an argon laser (Ar laser) unit 12, beam benders 13, 23–25, 28–30, 35, 41, 44, 45 and 54, adjusting targets 15, 17 and 33, a half prism 16, a beam bender (half mirror) 14, and lenses 52, 53, 65, 71, on a table 10. The laser drawing apparatus 11 further includes acoustooptic modulators 19 and 20, beam separators 21 and 22, pitch changing convergent optical systems 26, 31, 27 and 32, acoustooptic modulators of 8 channels 36 and 37, a beam bender 38, a condenser optical system 34, a λ/2 plate 39, a polarization beam splitter 40, an image rotator 43, a polygonal mirror 46, an fθ lens 47, a gathering lens 48 for an X-scale, a condenser lens 49, an X-scale 50, a mirror 60, monitoring mirrors 51a and 51b, and a photo detector 62 for the X-scale. The adjusting targets 15, 17 and 33 are reference marks (FIG. 8) which are adapted to confirm optical paths of groups of beams L2 and L3 and monitoring beam Lm when the Ar laser device 12 is exchanged.

There is a substrate setting device (not shown) in the vicinity of the laser drawing apparatus 11 to form a substrate S on a drawing table surface T (indicated at a two-dotted and dashed line) corresponding to an image surface. The substrate setting device is provided with a Y-table (not shown) which is movable in the Y-direction (i.e., sub-scanning direction of the polygonal mirror 46 corresponding to the transverse direction in FIG. 1) and a swing mechanism (not shown) which swings about a rotational shaft (not shown) in the vertical direction in FIG. 1.

The Ar laser (i.e., laser source) 12 is a water-cooled type having an output of 1.8 W which emits laser beam L1 whose wavelength is 488 nm. The acoustooptic modulators 19 and 20 adjust the quantity(power) of beams L2 and L3 which are split by the half prism (i.e., first beam splitting means) 16, so that the quantities of the beams L2 and L3 are identical. The acoustooptic modulators 19 and 20 also carry out the fine adjustment of the inclination of the reflecting surfaces 46a (FIG. 14) of the polygonal mirror (i.e., beam scanning means) 46 in accordance with data on the inclination of each reflecting surface 46a, stored in a memory (not shown) of a control means 8. To prevent the acoustooptic modulators 19 and 20 from being broken due to an excess quantity of light received thereby, the slit beams L2 and L3 which are obtained by splitting the laser beam L1 are made incident upon the acoustooptic modulators 19 and 20.

Figure 4:
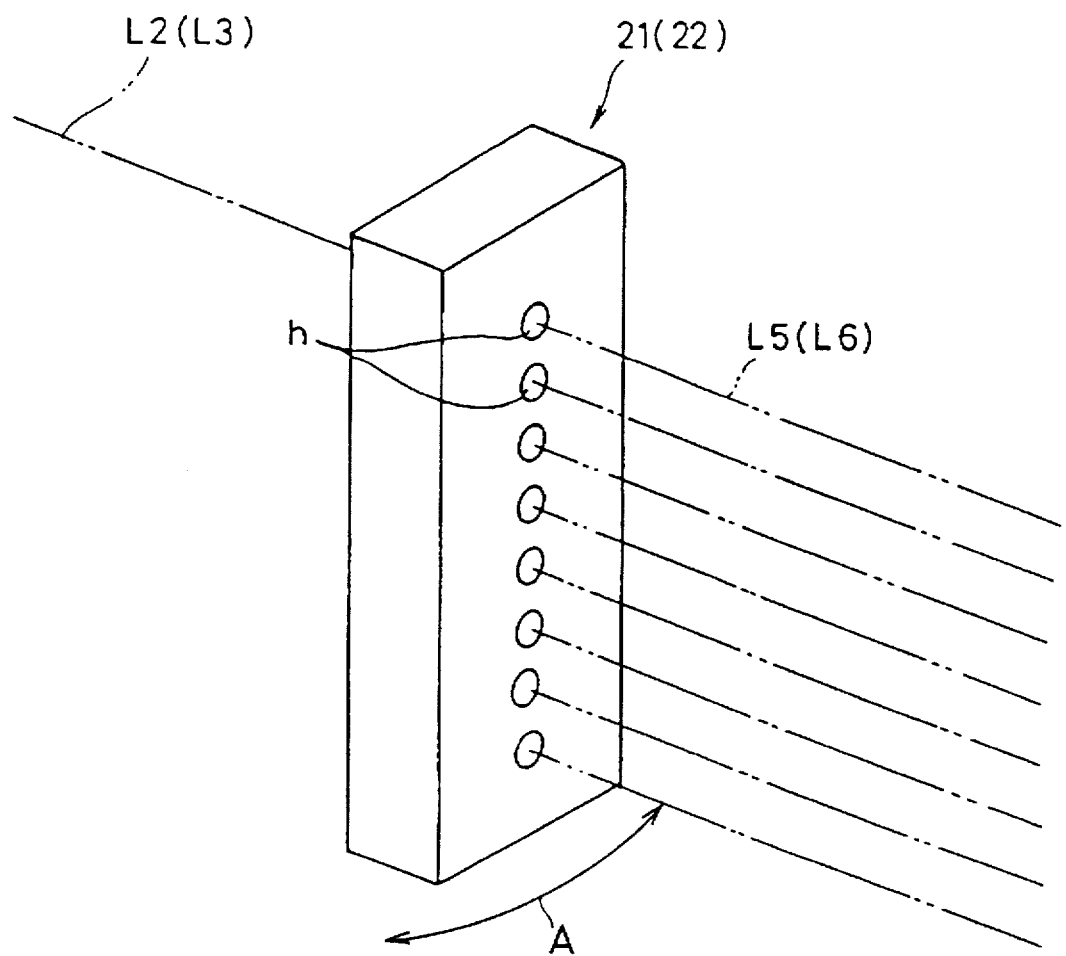
FIG. 4 is an enlarged perspective view of a beam separator in a laser drawing apparatus shown in FIG. 1.
Figure 7:
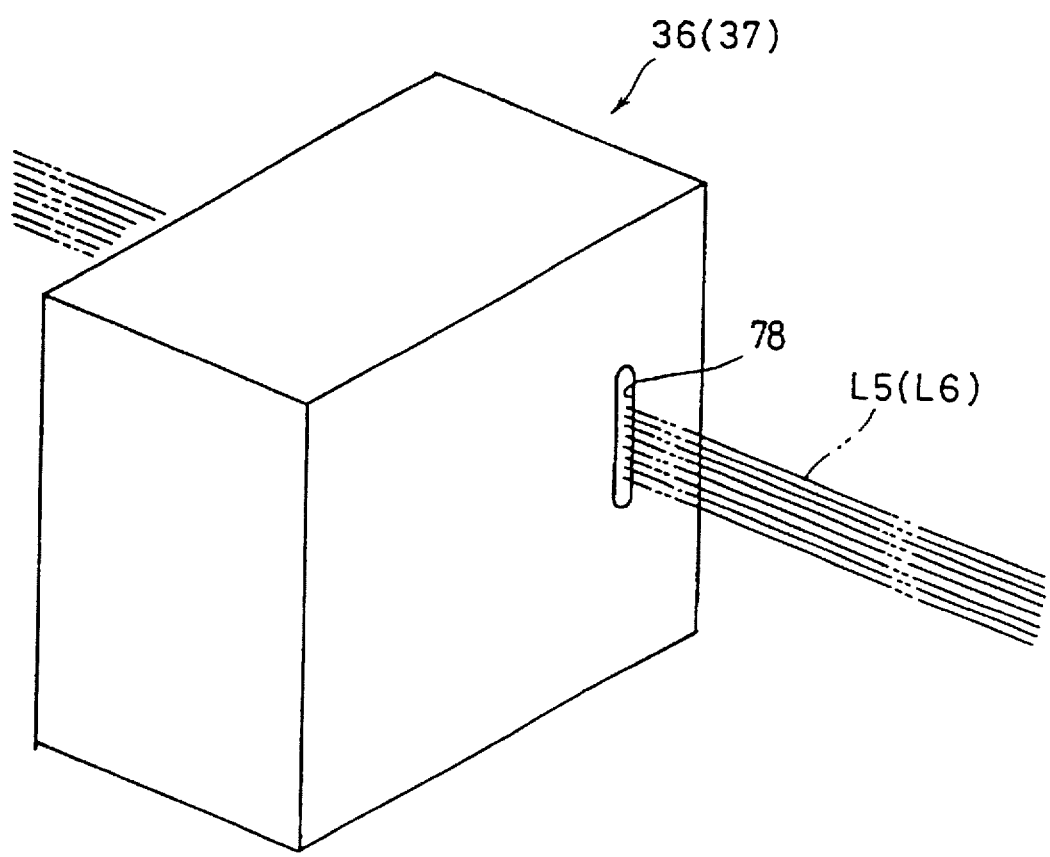
FIG. 7 is a perspective view of an acoustooptic modulator in a laser drawing apparatus shown in FIG. 1.

The beams L2 and L3 emitted from the acoustooptic modulators 19 and 20 are made incident upon the beam separators (i.e., second beam splitting means) 21 and 22 in which the beams L2 and L3 are respectively split into 8 first drawing beams L5 and 8 second drawing beams L6. As can be seen in FIG. 4, the beam separators 21 and 22 are respectively provided with 8 emission holes "h" aligned in the longitudinal direction (i.e., vertical direction in FIG. 4). The beam separators 21 and 22 are swingably supported by the swing adjusting mechanism 79 (FIG. 7) to rotate in the direction indicated at an arrow A (i.e., direction perpendicular to the optical path of the first and second beams L5 and L6) about respective pivot shafts coaxial to the respective uppermost emission holes "h".

Figure 5:
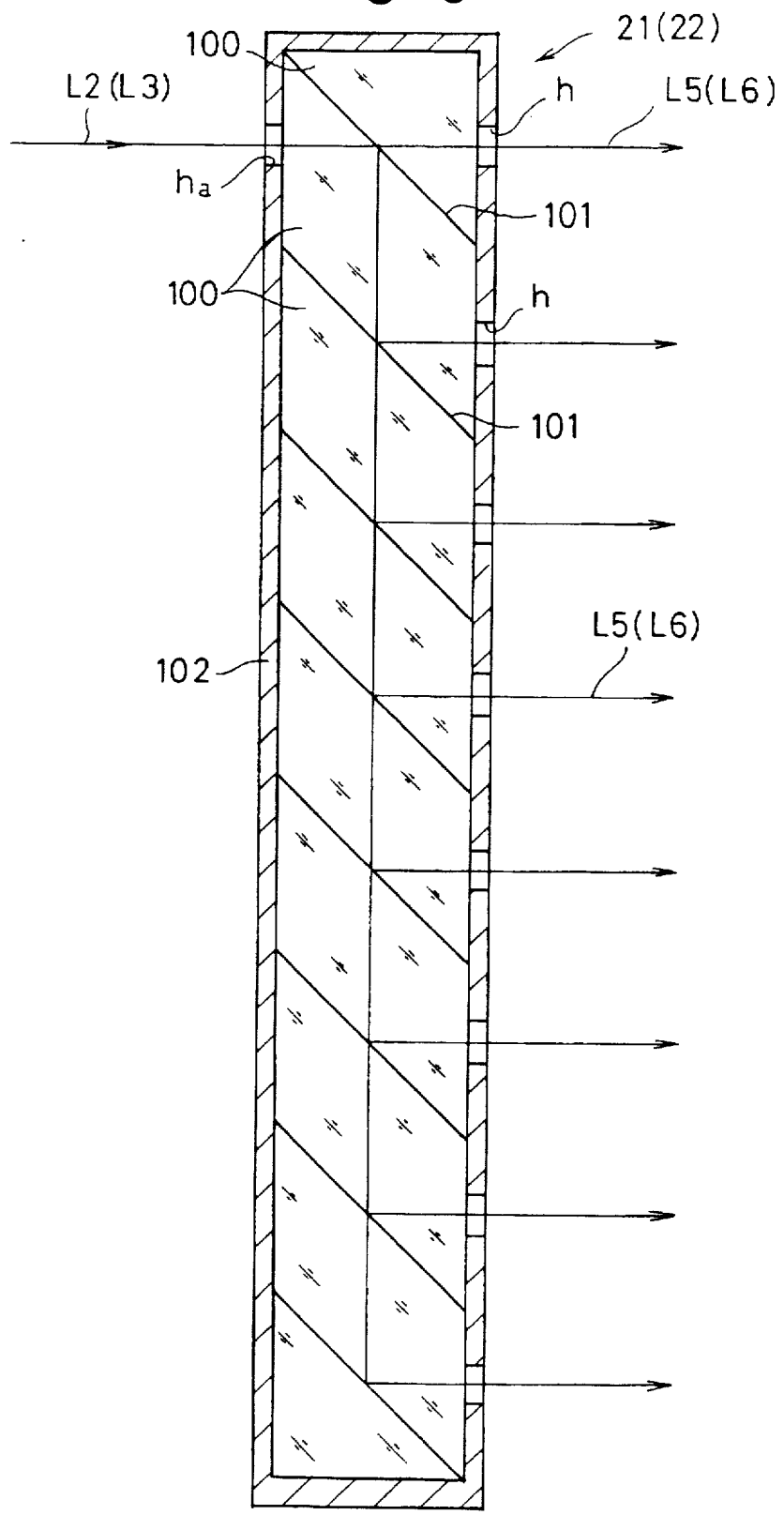
FIG. 5 is a sectional view of a beam separator shown in FIG. 4.

The beam separators 21 and 22 are respectively made of a plurality of optical elements 100 (FIG. 5) in the form of a plate, which are adhered to each other by an adhesive separating surfaces 101; then cut at an angle of 45° with respect to the separating surfaces; and thereafter enclosed by and in frames 102. The separating surfaces 101 partly reflect and partly transmit therethrough the beams L2 and L3 incident upon uppermost incident holes "ha" formed on the rear surfaces of the beam separators 21 and 22 to obtain groups of beams (first and second drawing beams L5 and L6) spaced at a predetermined distance.

Figure 9:
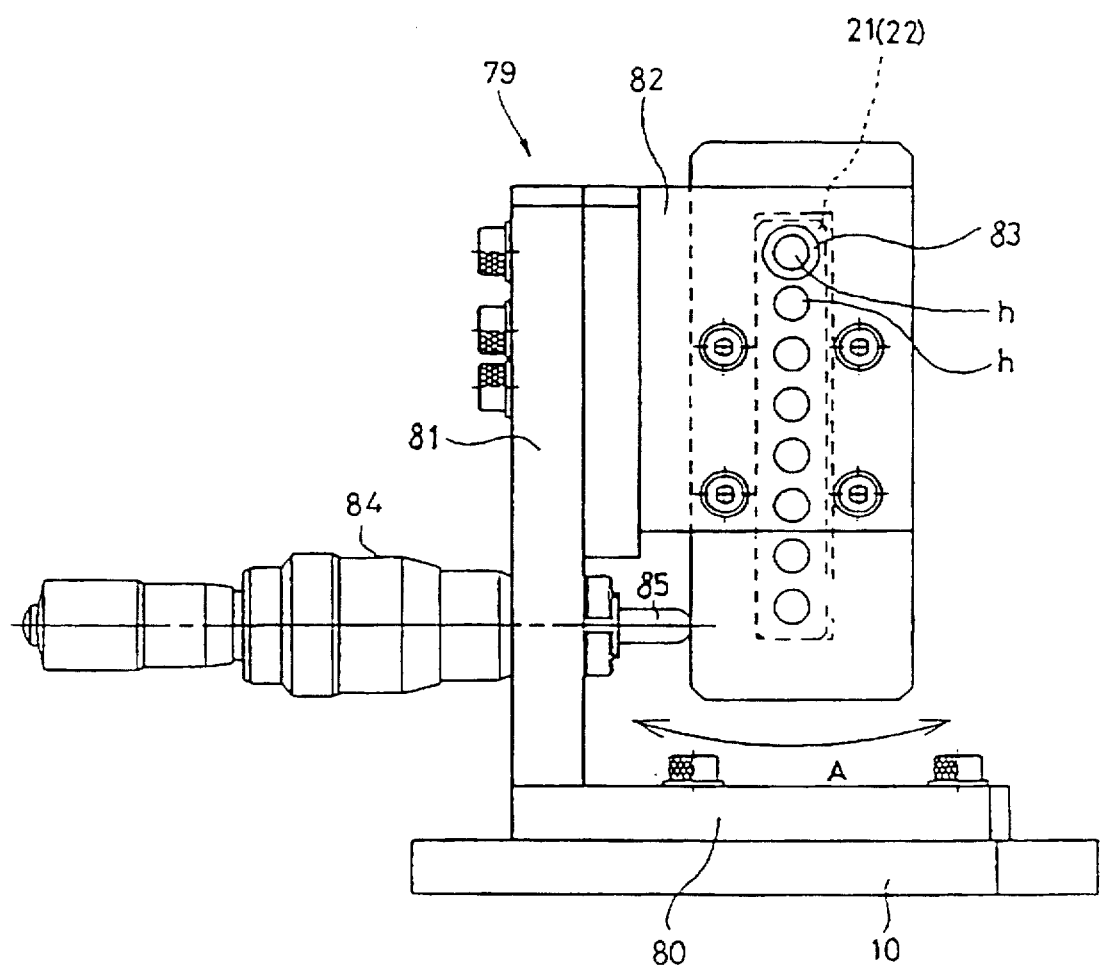
FIG. 9 is a front elevational view of a swing adjusting mechanism.
Figure 15:
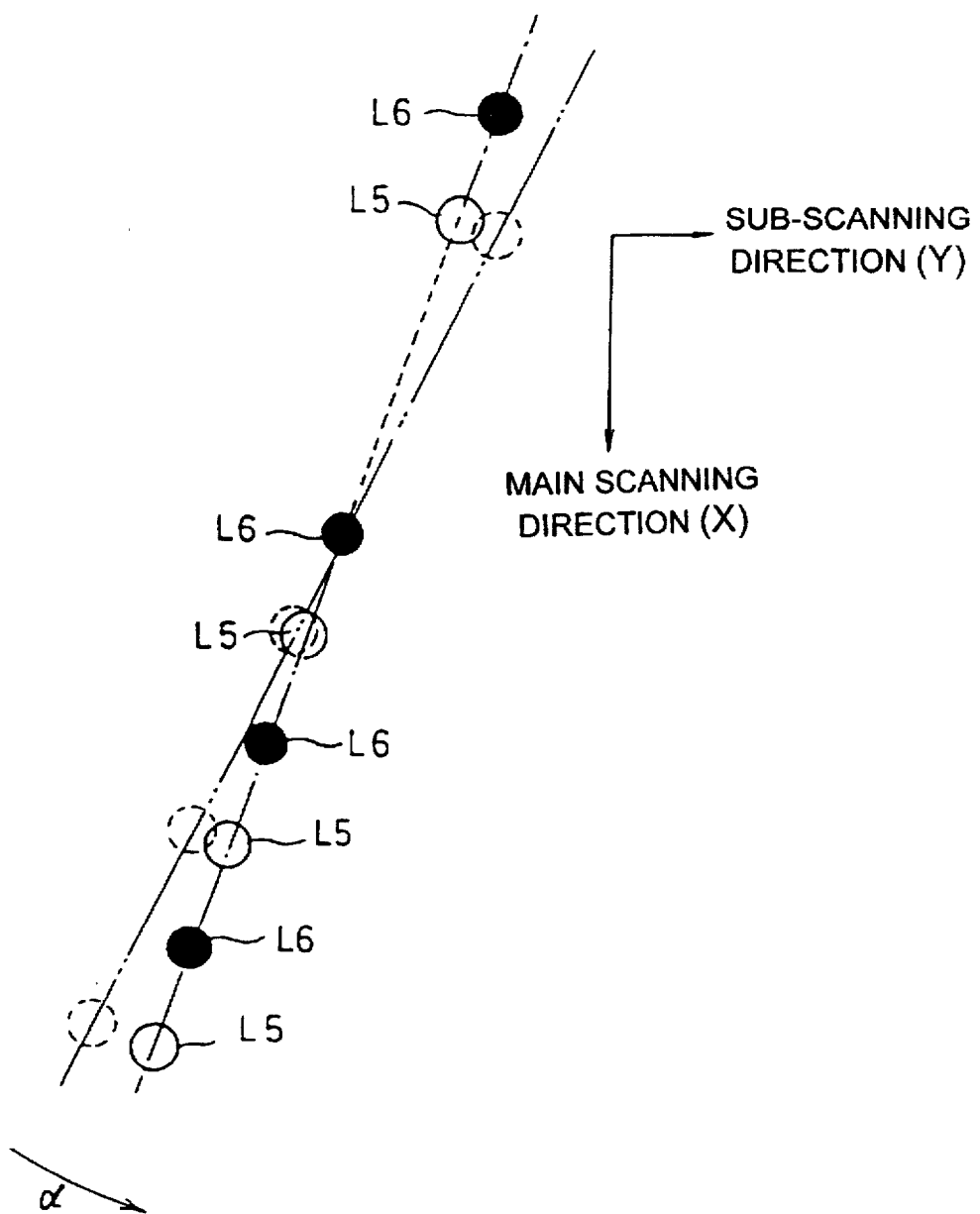
FIG. 15 is an explanatory view of two groups of drawing beams which are rotated.

The swing adjusting mechanism 79 includes a base portion 80 secured on the table 10 of the laser drawing apparatus 11, an upright supporting wall 81 projecting upward from the base portion 80, and a bracket 82 which extends at the upper end of the supporting wall 81 in parallel with the base portion 80, as shown in FIG. 9. The supporting wall 81 is provided with a micrometer head 84 which extends in the lateral direction in FIG. 9 (i.e., Y-direction in FIG. 1). The bracket 82 is provided with a pivot shaft 83 coaxial to the uppermost emission hole "h" of the beam separator 21 (22). The beam separator 21 (22) is rotatably biased in the clockwise direction in FIG. 9 about the pivot shaft 83 by a biasing means (not shown). A spindle 85 of the micrometer head 84 abuts at the front end thereof against the lower end of the beam separator 21 (22), so that when the spindle 85 is reciprocally moved in the longitudinal axial direction thereof by the micrometer head 84, the swing movement of the beam separator 21 (22) about the pivot shaft 83 in the direction "A" takes place to rotate the aligned drawing beams L5 (L6) about the axis of the pivot shaft 83 (FIG. 15) to thereby make the drawing beams L5 and L6 parallel to each other.

The group of first drawing beams L5 emitted from the beam separator 21 is made incident upon a pair of pitch changing convergent optical systems 26 and 31. The group of second drawing beams L6 emitted from the beam separator 22 is made incident upon a pair of pitch changing convergent optical systems 27 and 32. The pitch changing convergent optical systems 26, 31 and 27, 32 change the pitches of the 8 first drawing beams L5 and the 8 second drawing beams L6, split by the beam separators 21 and 22, so that the respective pitches correspond to the pitches of the 8 channel acoustooptic modulators 36 and 37.

Figure 13:
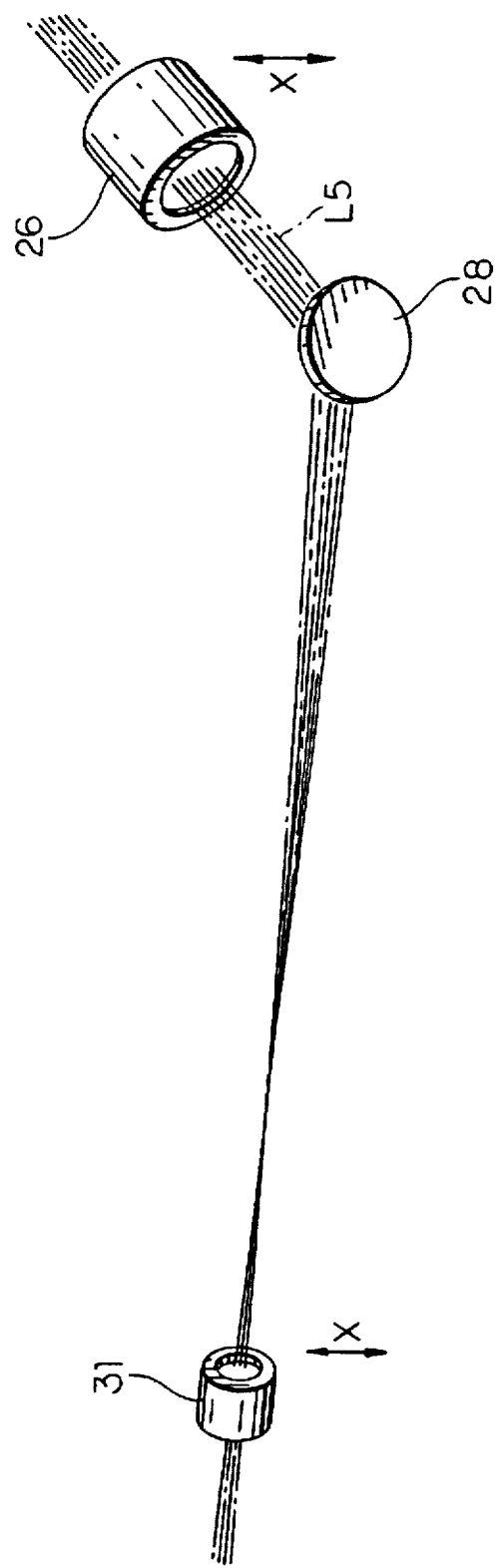
FIG. 13 is a perspective view of a pitch changing convergent optical system which constitutes the X-direction adjusting mechanism.
Figure 14:
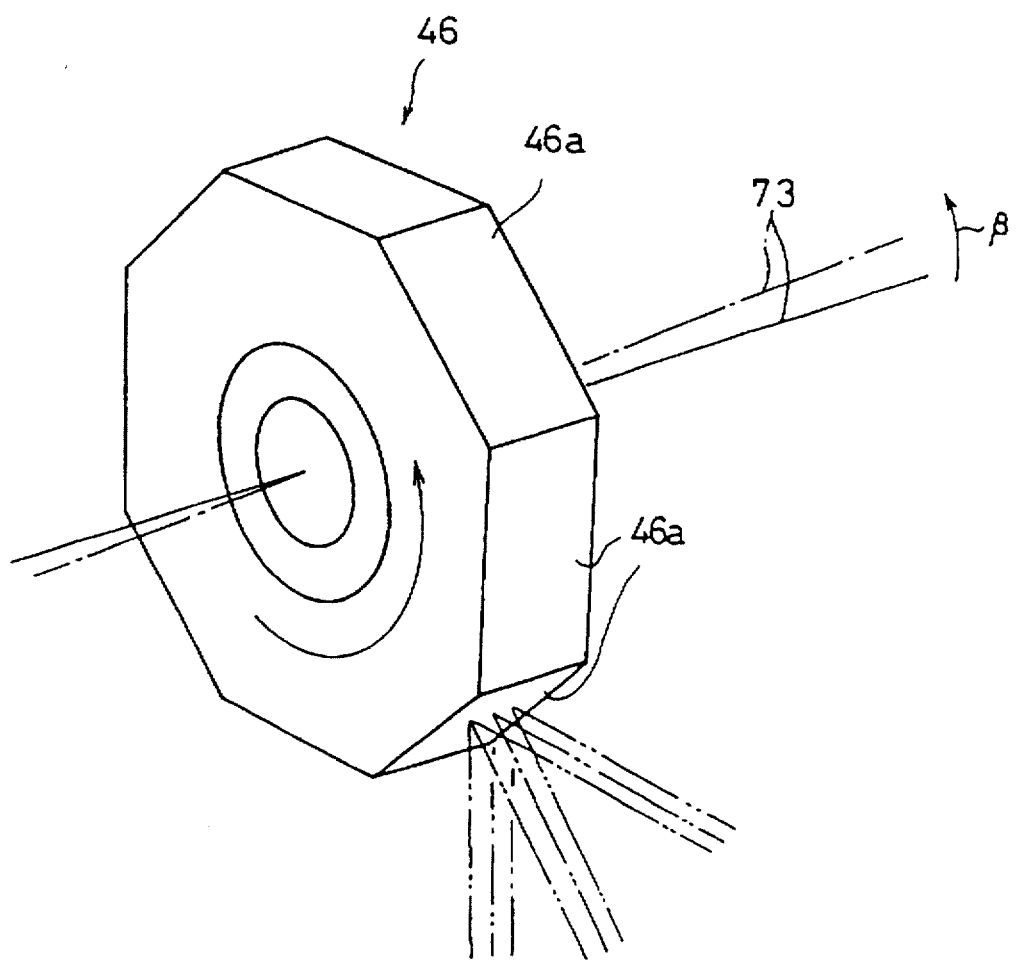
FIG. 14 is an enlarged perspective view of a polygonal mirror.

The pitch changing convergent optical systems 26 and 31 are moved and adjusted in the X-direction (FIGS. 1, 12, 13) by the X-direction adjusting mechanism 91 (FIG. 12) to move the first group L5 of aligned drawing beams toward the second bundle L6 of aligned drawing beams (FIG. 14). Thus, the pitch changing convergent optical systems 26 and 31 constitute a second adjusting means to adjust the deviation of the group of beams in the direction X.

Figure 12:
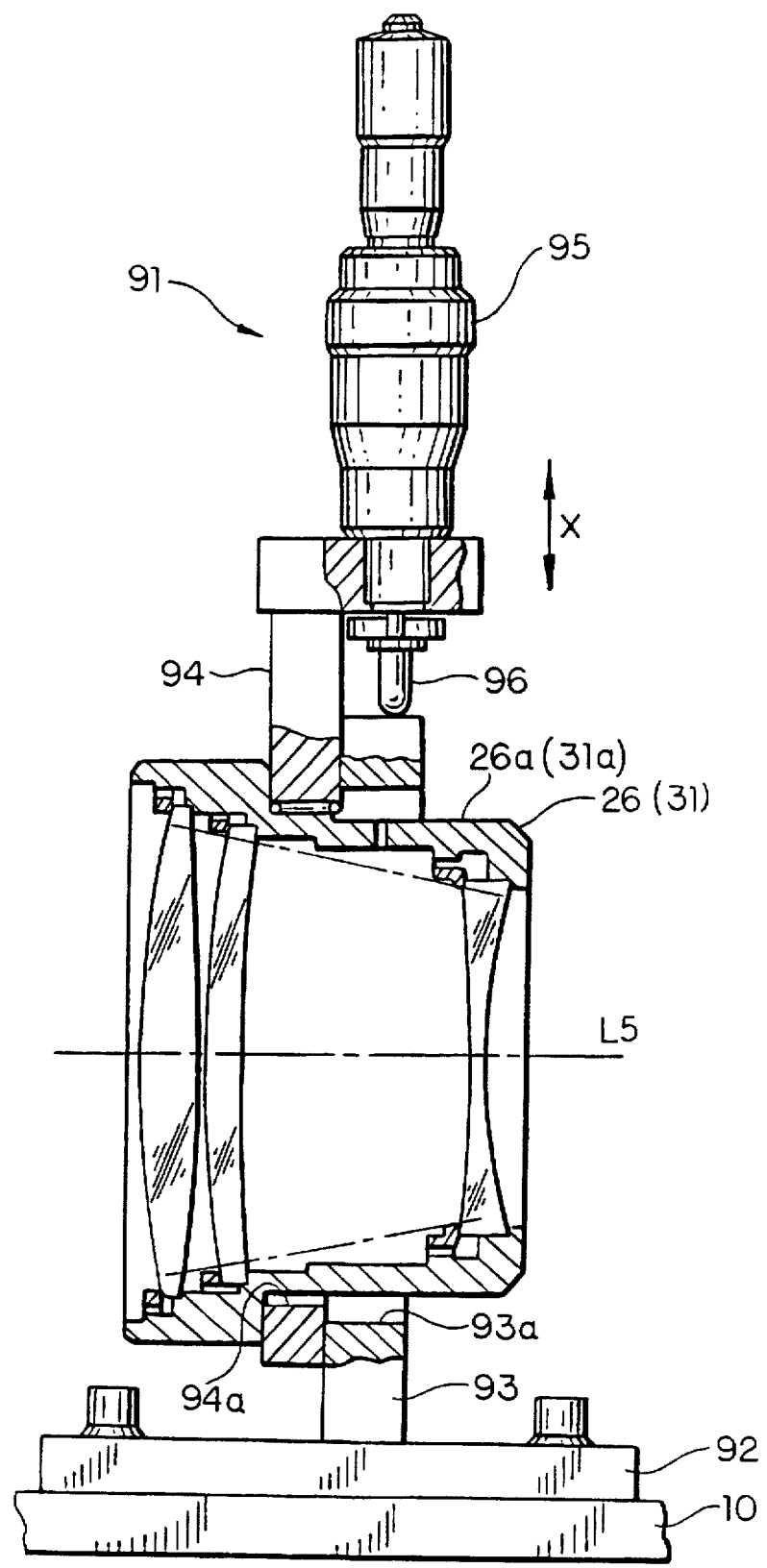
FIG. 12 is a sectional side view of an adjusting mechanism in an X-axis direction (X-direction adjusting mechanism)

The X-direction adjusting mechanism 91 includes a stationary supporting wall 93 which projects upward from the base portion 92, and a movable supporting wall 94 which is movable in the vertical direction (i.e., direction X) in FIG. 12. The micrometer head 95 is mounted to the upper portion of the movable supporting wall 94 extending in the vertical direction. The movable supporting wall 94 is provided with a supporting hole 94a extending therethrough, in which the pitch changing convergent optical system 26 (31) is secured. The stationary supporting wall 93 is provided with a hole 93a in which an annular portion 26a (31a) of the pitch changing convergent optical system 26 (31) is movably inserted.

The hole 93a has a diameter larger than the diameter of the annular portion 26a (31a) so as to permit the latter to move therein through the movable supporting wall 94. The movable supporting wall 94 is biased by a biasing means (not shown) in the vertical direction to bias the pitch changing convergent optical system 26 (31) and the micrometer head 95 in the same direction. Consequently, the spindle 96 of the micrometer head 95 is pressed at the front end thereof against the upper portion of the stationary supporting wall 93. With the arrangement of the X-direction adjusting mechanism 91 as constructed above, the pitch changing convergent optical system 26 (31) can be slid and adjusted in the vertical direction (X-direction) through the movable supporting wall 94 when the spindle 96 is reciprocally moved by the micrometer head 95.

Figure 10:
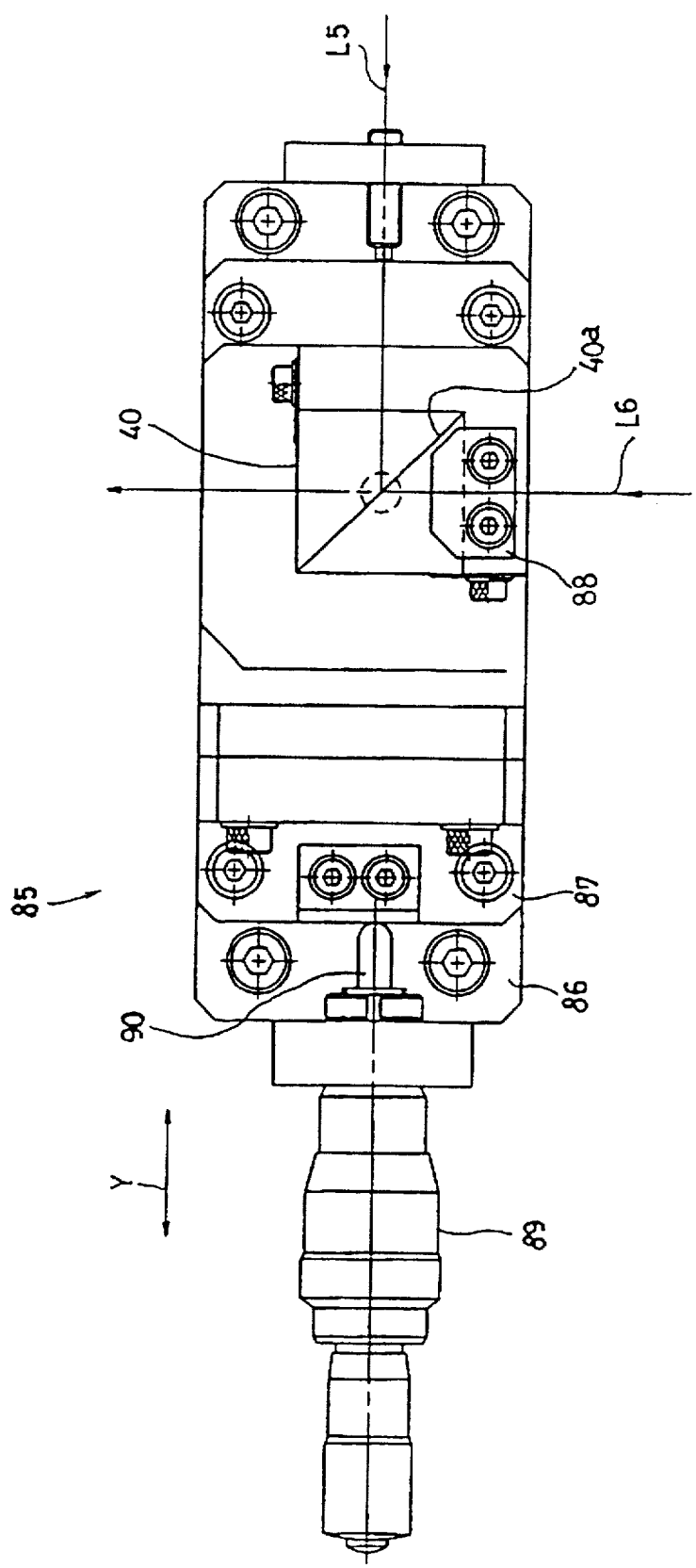
FIG. 10 is a plan view of an adjusting mechanism in a Y-axis direction (Y-direction adjusting mechanism)

The beam bender 38 and the polarization beam splitter 40 which constitute a Y-direction adjusting means (beam combining means) are moved to move the first drawing beams L5 in the direction Y, i.e., toward the second drawing beams L6 (FIG. 7), to thereby adjust the positional relationship therebetween. The beam bender 38 is rotated about the pivot shaft 38a (FIG. 2) extending in the direction X to move and adjust the first drawing beams L5 in the direction Y. The polarization beam splitter 40 is supported by the Y-axis adjusting mechanism 85 (FIG. 10) so as to move in the direction Y.

Figure 11:
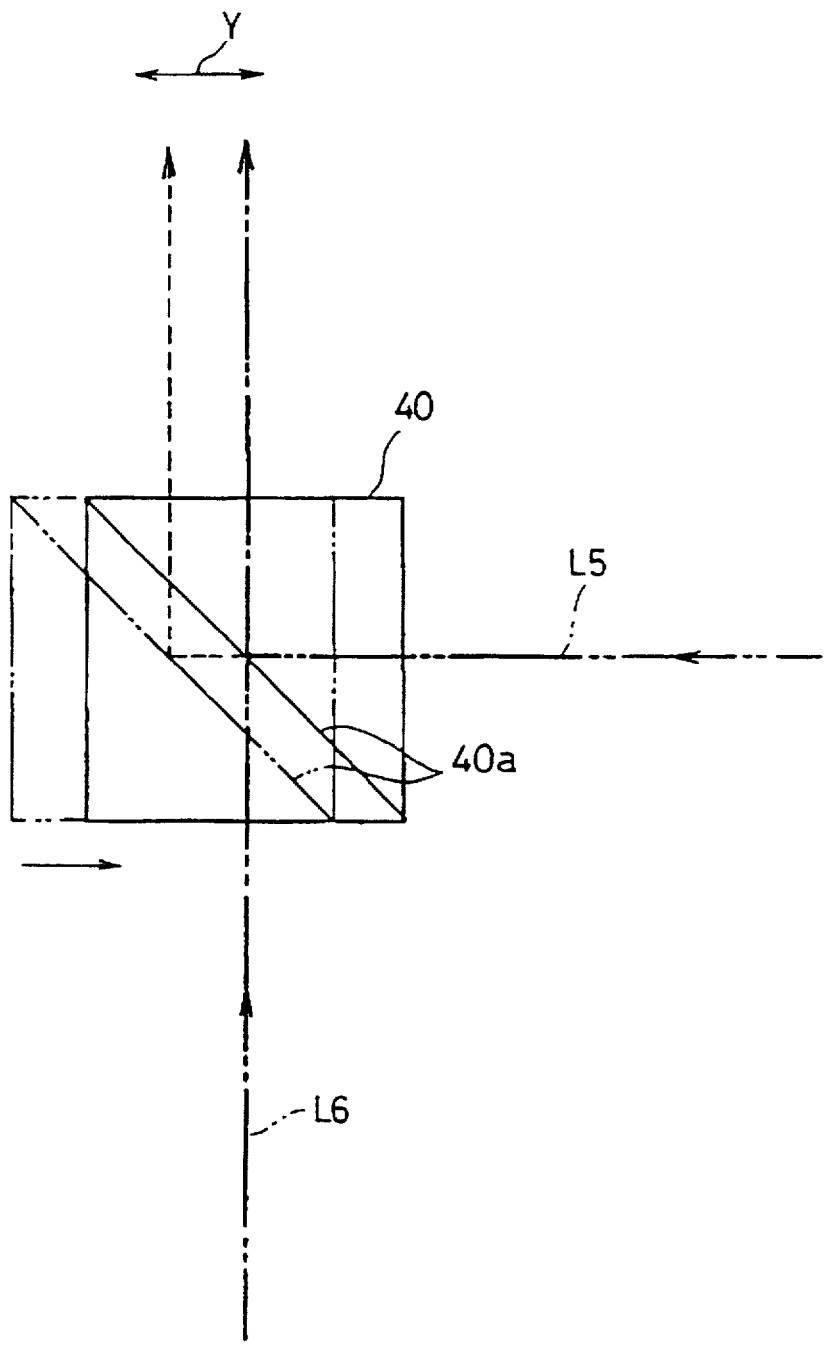
FIG. 11 is a plan view of a polarization beam splitter which is slid in the Y-axis direction by the Y-direction adjusting mechanism.

The Y-direction adjusting mechanism 85 includes a base portion 86 secured to the table 10 of the laser drawing apparatus 11, a movable portion 87 capable of moving in the direction Y with respect to the base portion 86, and a micrometer head 89 which is supported by the base portion 86 to extend in the direction Y. The polarization beam splitter 40 is secured to the movable portion 87, so that the half mirror surface 40a of the polarization beam splitter 40 is inclined at an angle of 45° with respect to the direction Y. The movable portion 87 is biased by a biasing means (not shown) toward the micrometer head 89 (i.e., the left direction in FIG. 10), so that one side surface thereof is pressed against the front end of the spindle 90 of the micrometer head 89. Consequently, when the spindle 90 is moved in the longitudinal direction thereof by the operation of the micrometer head 89, the polarization beam splitter 40 is moved in the direction Y to move and adjust the first drawing beams L5 in the direction Y (FIG. 11).

The polarization beam splitter 40 constitutes a beam combining means to alternately align the first group L5 of the aligned drawing beams deflected by the beam bender 38 and the second group L6 of the aligned drawing beams transmitted through the λ/2 plate 39 at a predetermined pitch in the direction X. The direction of polarization of the first drawing beams L5 is not changed in order to be deflected by 90° by the half mirror surface 40a. Then the direction of polarization of the second drawing beams L6 is changed by 90° with respect to the direction of polarization of the first drawing beams L5 through the λ/2 plate 39 in order to passe through the half mirror surface 40a. Hence, the drawing beams L5 and L6 having a difference of 90° in the direction of polarization are combined by the polarization beam splitter 40 to be alternately aligned along one line in the direction X.

The 8-channel acoustooptic modulators 36 and 37 function to eliminate the difference in the quantity of light between 8 first drawing beams L5 and 8 second drawing beams L6. The acoustooptic modulators 36 and 37 also function to independently control the drawing beams L5 and L6 split by the beam separators 21 and 22 through the control means 8 in accordance with predetermined data to thereby provide independent ON/OFF drawing data to the first and second drawing beams L5 and L6. The acoustooptic modulators 36 and 37 are each made of a crystal of tellurium dioxide, for example, which exhibits an acoustooptic effect that the refractive index of the crystal is slightly changed in proportion to the frequency of an ultrasonic wave to be applied to the crystal.

The acoustooptic modulators 36 and 37 generate a traveling-wave shape of ultrasonic wave within the crystal to thereby diffract the laser beam, when a high frequency electric field is applied to transducers provided at the opposed ends of the crystal. When a high frequency electric field is not applied to the transducers, the laser beam incident upon the crystal at a Bragg angle is transmitted through the acoustooptic modulators. Consequently, the ON/OFF control of the incident beams, i.e., the drawing beams L5 and L6 can be optionally and easily carried out by switching the application of the high frequency electric field to the acoustooptic modulators 36 and 37. Each of the acoustooptic modulators 36 and 37 has 8 channels aligned so as to receive the aligned drawing beams L5 (L6) and modulate the incident beams in the transverse direction (direction Y in FIG. 1). Moreover, the acoustooptic modulators 36 and 37 are each provided with a slit 78 (FIG. 7) elongated in the vertical direction (direction X in FIG. 1) so as to correspond to the 8 channels.

The monitoring beam Lm is independent from the beams L2 (L5) and L3 (L6) and has an optical path spaced from the optical paths of the drawing beams L5 and L6 at a predetermined distance. The monitoring beam Lm is deflected by the mirrors 54 and 25 and travels along an optical path spaced from the drawing beams L5 and L6 at a predetermined distance. Thereafter, the monitoring beam Lm is deflected by the mirrors 35 and 60 to come close to the drawing beams L5 and L6. Thereafter, the monitoring beam Lm passes along an optical path close to the optical paths of the drawing beams L5 and L6 through the lens 71, the beam bender 41 and the lens 52, etc.

The image rotator 43 is comprised of a mirror system which converges the 16 aligned beams of the drawing beams L5 and L6 onto the substrate S located at the drawing table surface T with a predetermined oblique angle, upon scanning by the polygonal mirror 46. Therefore, although the 16 beams of the first and second drawing beams L5 and L6 are aligned along one line in the main scanning direction (i.e., direction X) of the polygonal mirror 46 before they are made incident upon the image rotator 43, the 16 beams are rotated with respect to the direction X in the clockwise direction by a predetermined angle when emitted from the image rotator 43, as can be seen, for example, in FIG. 15.

The first and second drawing beams L5 and L6 and the monitoring beam Lm are deflected by the beam benders 44 and 45 and are thereafter made incident upon the reflecting surfaces 46a of the polygonal mirror 46. When the polygonal mirror 46 rotates about the rotating shaft 73 in the counterclockwise direction in FIG. 14, the deflection angle θ is continuously changed to move (i.e., scan) the first and second drawing beams L5 and L6 and the monitoring beam Lm through the reflecting surfaces 46a which rotate in the same direction. Consequently, the first and second drawing beams L5 and L6 are transmitted through the fθ lens 47 and the condenser lens 49, and converged onto the substrate S located at the table surface T. The rotating shaft 73 of the polygonal mirror 46 is supported by a supporting means (not shown) so that the inclination thereof in the sub-scanning direction Y can be displaced by an angle β. Hence, the perpendicularity of the main scanning line with respect to the sub-scanning line in the polygonal mirror 46 can be easily and optionally adjusted.

The fθ lens 47 contributes to an elimination of the problem that the position of the point image of the drawing beams on the scanning surface of the table surface T (FIG. 1) is not proportional to the deflection angle θ but is scanned at a higher scanning speed determined by tanθ at the upper portion of the scanning surface. The fθ lens 47 is comprised of a plurality of convex and concave lenses, wherein the image height of the point image on the scanning surface is proportional to the deflection angle θ defined by the reflected beam and the optical axis of the fθ lens, so that the drawing beams can be moved (i.e., scanned) at an equal scanning speed.

The monitoring beam Lm transmitted through the fθ lens 47 and the condenser lens 49 together with the first and second drawing beams L5 and L6 is successively reflected by the mirrors 51a and 51b to change the direction thereof by 180° and is made incident upon the X-scale 50 located at a position equivalent to the image forming surface of the table surface T. The X-scale 50 is made of a glass plate provided with a slit(s) to function as a linear encoder. The monitoring beam Lm transmitted through the X-scale 50 is reflected and converged by elongated mirrors 63 and 64, and is then converged by the condenser lens 48 for the X-scale to be made incident upon the photo-detector 62 for the X-scale. When the positions of the 16 beams of the first and second drawing beams L5 and L6 are detected in accordance with the position of the monitoring beam Lm detected by the photo-detector 62, the control signal is sent from the control means 8 (e.g., micro computer) in accordance with the detection data thus obtained. Consequently, the 16 beams of the first and second drawing beams L5 and L6 are independently controlled (i.e., turned ON and OFF) in accordance with the control signal.

Figure 20:
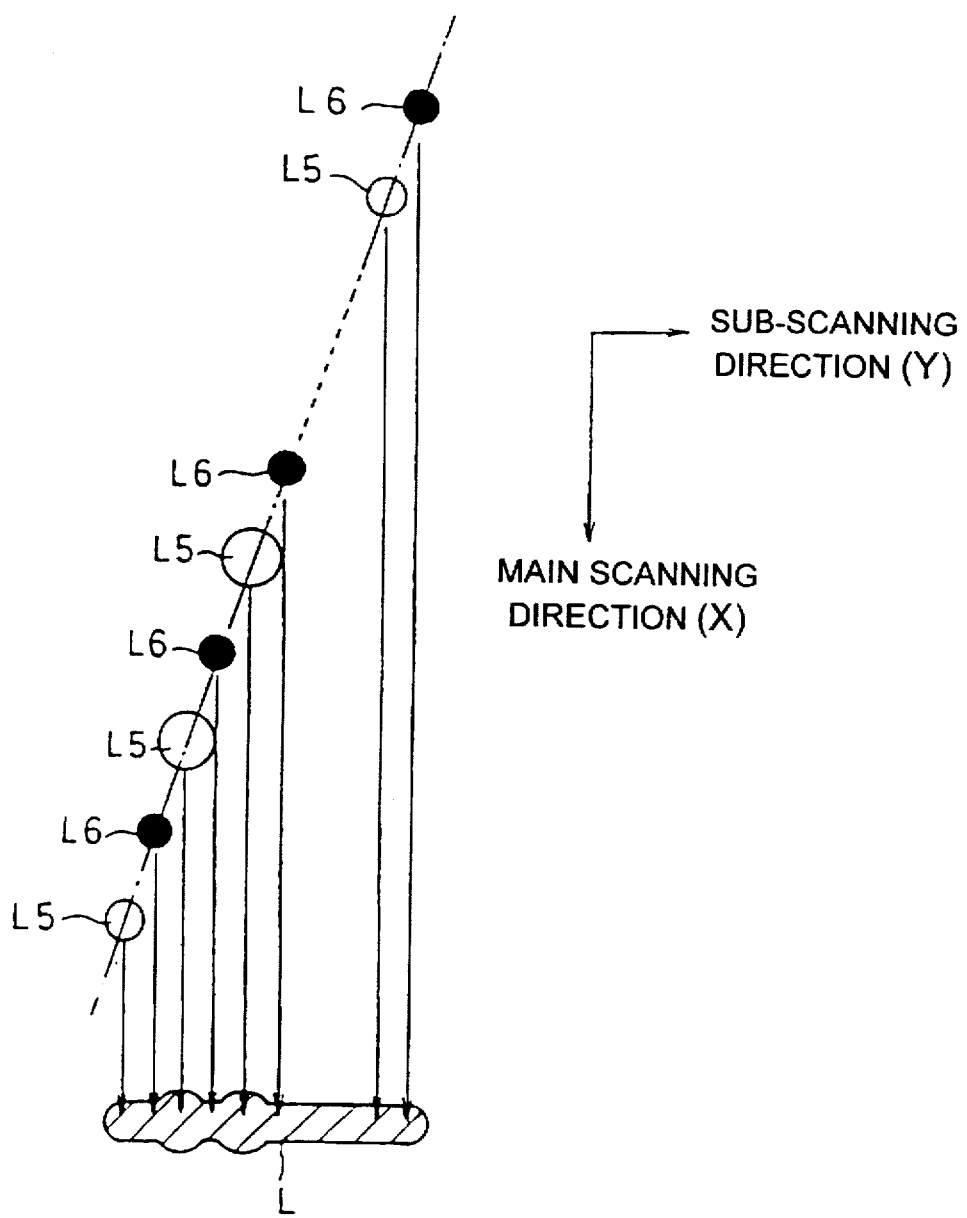
FIG. 20 is an explanatory view of a group of drawing beams and a line drawn by the drawing beams, before an amendment is carried out; and, FIG. 21 is an explanatory view of a group of drawing beams and a line drawn by the drawing beams, after an amendment is carried out.

The beam spots of the first and second drawing beams L5 and L6 which are made incident upon the drawing table surface T at a slightly oblique angle are adjusted through the acoustooptic modulators 36 and 37 each having 8 channels so that the each spot diameter is for example 30 μm. Consequently, the irregularity in quantity(power) of the beam among the beam spots, as shown in FIG. 20 can be eliminated, as can be seen in FIG. 21. In the illustrated embodiment, the pitch of the beam spots, i.e., the distance "a" (FIG. 18) between the adjacent spots is adjusted to be for example 5 μm through the acoustooptic modulators 36 and 37.

Figure 18:
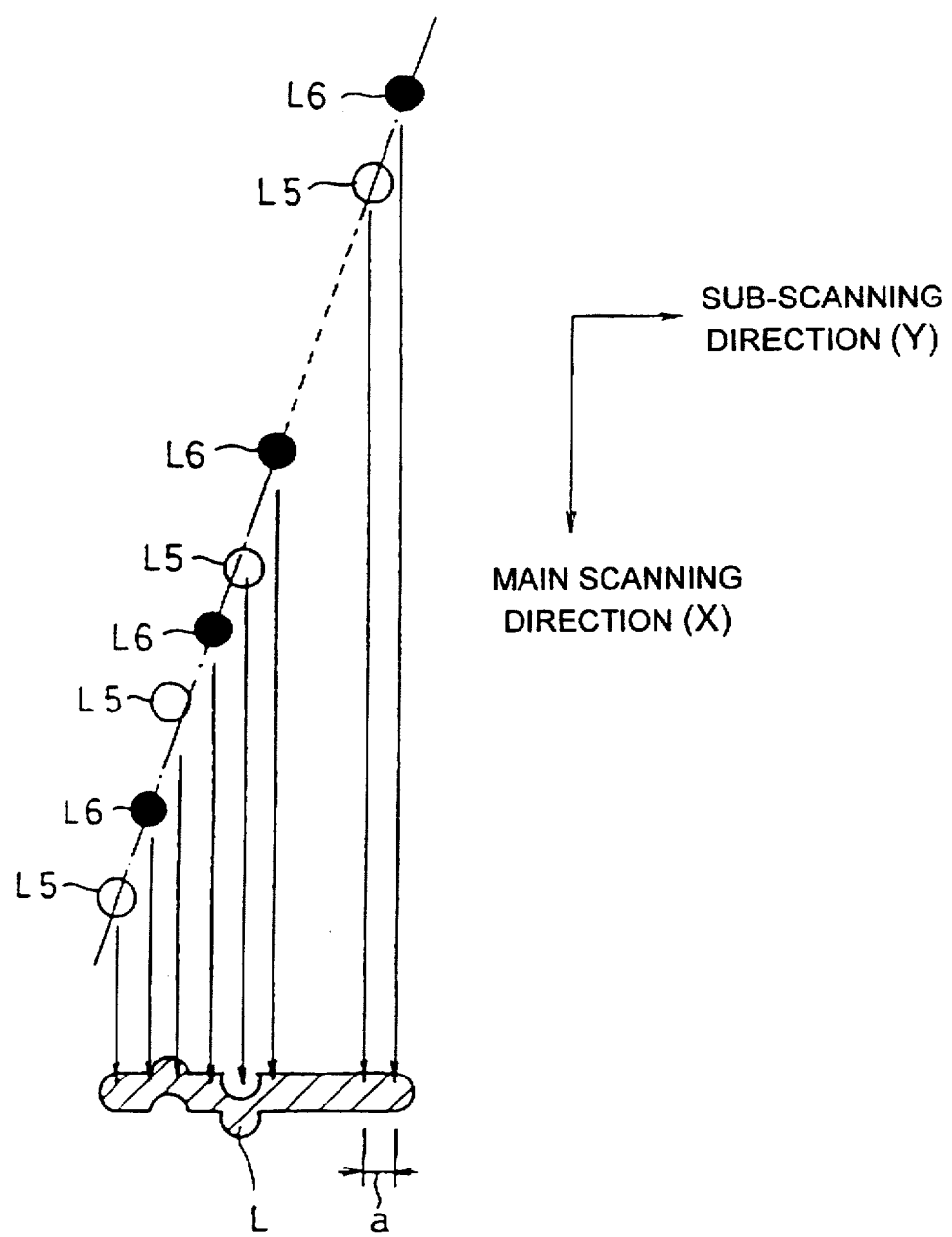
FIG. 18 is an explanatory view of a group of drawing beams and a line drawn by the drawing beams, before an amendment is carried out.
Figure 19:
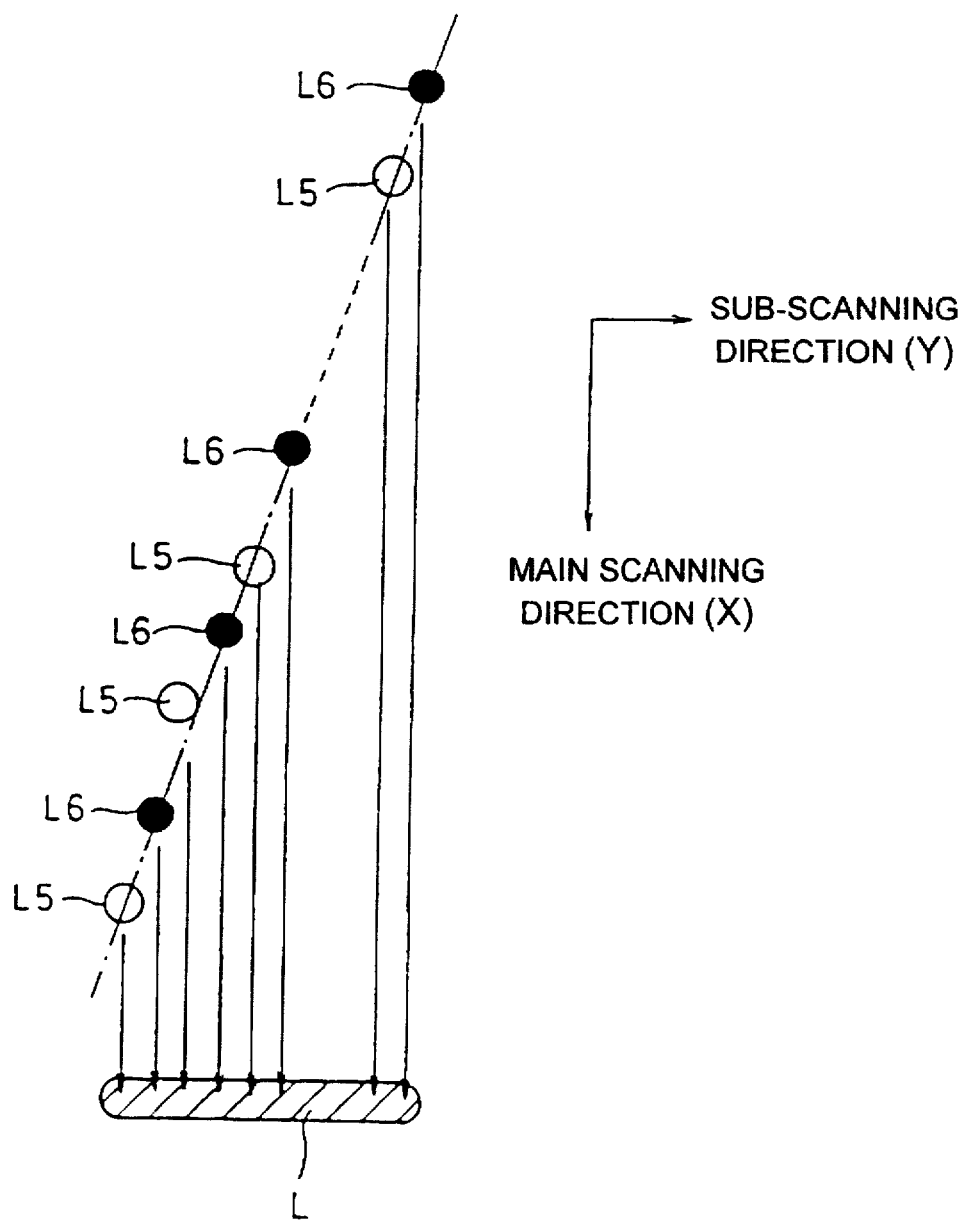
FIG. 19 is an explanatory view of a group of drawing beams and a line drawn by the drawing beams, after an amendment is carried out.

The line L (FIGS. 18 through 21) drawn with the beam spots aligned along the sub-scanning direction is formed by appropriately turning ON and OFF the acoustooptic modulators 36 and 37. Upon drawing the line L, it is necessary to provide a space "c" (FIG. 21) between the adjacent beam spots of the drawing beams L5 and L6 in order to prevent an interference therebetween. For example, if the exposure by the drawing beam L6 adjacent to the lowermost drawing beam L5 takes place immediately after the completion of the exposure by the lowermost drawing beam L5 in FIG. 21, a straight drawing line L is not obtained. To this end, in the laser drawing apparatus 11 according to the present invention, the control means 8 retards the exposure of the subsequent drawing beam L5 by a predetermined delay time. Consequently, the subsequent beam spot of the second drawing beam L6 can be properly superimposed on the preceding beam spot of the first drawing beam L5 that has been exposed. The straight line L, as shown in FIG. 21, can be formed by repeating the control process as mentioned above. In the control operation, if the line L is not straight due to the irregularity in the position of the beam spots, as shown in FIG. 18, the modulation timing of the acoustooptic modulators 36 and 37 is varied in accordance with the control signal issued from the control means 8 to correct the drawing line L, as shown in FIG. 19.

Figure 6:
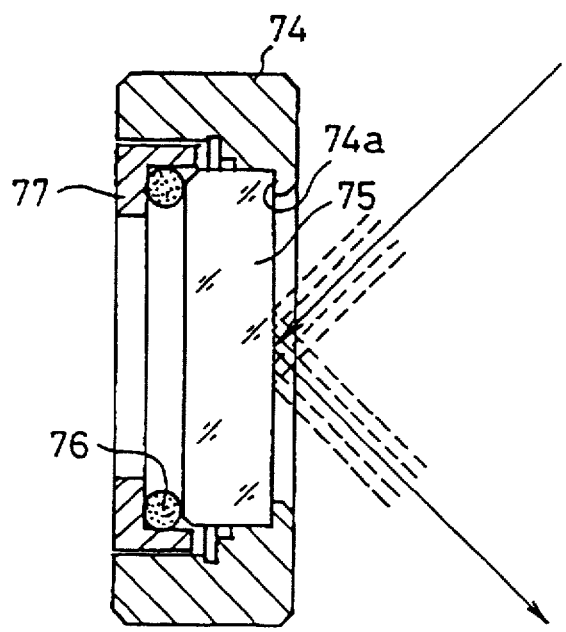
FIG. 6 is a sectional view of a beam bender in a laser drawing apparatus shown in FIG. 1.

The beam benders 13, 14, 23 through 25, 28 through 30, 35, 38, 41, 44, 45 and 54 are respectively provided with annular mirror supporting members 74. Each mirror supporting member 74 is provided on the front surface (right side in FIG. 6) thereof with an inner peripheral flange 74a which constitutes an abutting surface, as shown in FIG. 6. The mirror 75 which is fitted in the mirror supporting member 74 abuts against the rear surface of the inner peripheral flange 74a. A keep ring 77 is screwed in the mirror supporting member 74 through an annular shock absorbing member 76. Consequently, not only can the mirror 75 be easily exchanged, but also the mirror 75 can be always positioned at a reference position.

The laser drawing apparatus 11 according to the present invention operates as follows.

First of all, the substrate S on which the circuit pattern is to be formed is set at an appropriate position in which the positioning hole (not shown) of the substrate is registered with the corresponding portion of the substrate setting apparatus (not shown). When the substrate S is set in the reference position, the substrate S is movable in the direction Y and swingable about the pivot shaft (not shown) by the Y-table and the swing mechanism (not shown) of the substrate setting apparatus.

In this state, the Ar laser 12 is activated to emit the laser beam L1. Consequently, the laser beam L1 is deflected by the beam bender 13; transmitted through the adjusting target 15; and made incident upon the half prism 16 in which the laser beam is split into the beam L2 which runs straight and the drawing beam deflected by 90° toward the half mirror 14. The deflected beam is then split by the half mirror 14 into the drawing beam L3 which is deflected by 90° to run parallel to the second drawing beam L2 and the monitoring beam Lm which is made incident upon the mirror 54 wherein the monitoring beam Lm is deflected by 90°.

The beam L2 is made incident upon the acoustooptic modulator 19 through the lens 65, the adjusting target 17 and the lens 67; and the beam L3 is transmitted through the lenses 66 and 68 and made incident upon the acoustooptic modulator 20. The difference in the quantity of light between the beams L2 and L3 is eliminated by the acoustooptic modulators 19 and 20. The beam L2 and L3 are split into the 8 first drawing beams L5 and the 8 second drawing beams L6 that are in parallel with the first drawing beams L5 in the direction X by the beam separators 21 and 22, respectively. The first and second drawing beams L5 and L6 are transmitted through the pitch changing convergent optical systems 26 and 27; deflected by 90° through the beam benders 28 and 29; and, made incident upon the acoustooptic modulators 36 and 37 through the pitch changing convergent optical systems 31 and 32, respectively.

The difference in the quantity of light among the 8 beams of the respective first and second drawing beams L5 and L6 is eliminated in accordance with the acoustooptic effect of the acoustooptic modulators 36 and 37 each having 8 channels. The drawing beams L5 and L6 are controlled (turned ON and OFF) by the control means 8 in accordance with the selective application of the high frequency electric field to the acoustooptic modulators 36 and 37.

The first drawing beams L5 emitted from the acoustooptic modulator 36 is deflected by 90° through the beam bender 38. The first drawing beam L5 is then made incident upon the polarization beam splitter 40 and deflected by 90° by the half mirror surface 40a. The second drawing beams L6 emitted from the acoustooptic modulator 37 is transmitted through the λ/2 plate 39 wherein the direction of polarization thereof is changed. The second drawing beam L6 is then made incident upon the polarization beam splitter 40 and passes through the half mirror surface 40a. The drawing beams L5 and L6, each having 8 beams are successively combined by the polarization beam splitter 40, so that the 16 beams are aligned along one line in the direction X.

The control means 8 actuates the substrate setting apparatus (not shown) in synchronization with the scanning operation of the drawing beams L5 and L6 by the polygonal mirror 46 to slide the substrate S on the drawing table surface T in the direction Y. Consequently, a two-dimensional predetermined circuit pattern is formed (i.e., drawn or exposed) on the substrate S by the 16 beams of the drawing beams L5 and L6 that are selectively emitted in a slightly oblique angle with respect to the direction X. The drawing speed is theoretically 16 times the drawing speed at which a circuit pattern is drawn by one drawing beam.

The following adjustment of the drawing beams can be effected prior to the commencement of the drawing operation by the laser drawing apparatus 11. For instance, a detector 9 such as a CCD is set on the drawing table surface T. Similar to the drawing operation of a circuit pattern on the substrate S, the laser beam L1 is emitted from the Ar laser 12, so that the split beams L5 and L6 are made incident upon the detector 9. The micrometer head 84 of the swing adjusting mechanism 79 is actuated while observing the drawn image detected by the detector 9. Consequently, the beam separator 22 is swung about the rotating shaft 83 in the direction A in FIG. 9 to rotate the aligned drawing beams L5, for example, in the direction α in FIG. 15 to thereby adjust the aligned drawing beams L5 to be in parallel with the aligned drawing beams L6. Alternatively, it is possible to swing the beam separator 21 about the rotating shaft 83 to rotate the aligned drawing beams L6 in the direction opposite to the direction α in FIG. 15 to thereby adjust the aligned drawing beams L6 to be parallel with the aligned drawing beams L5.

Figure 16:
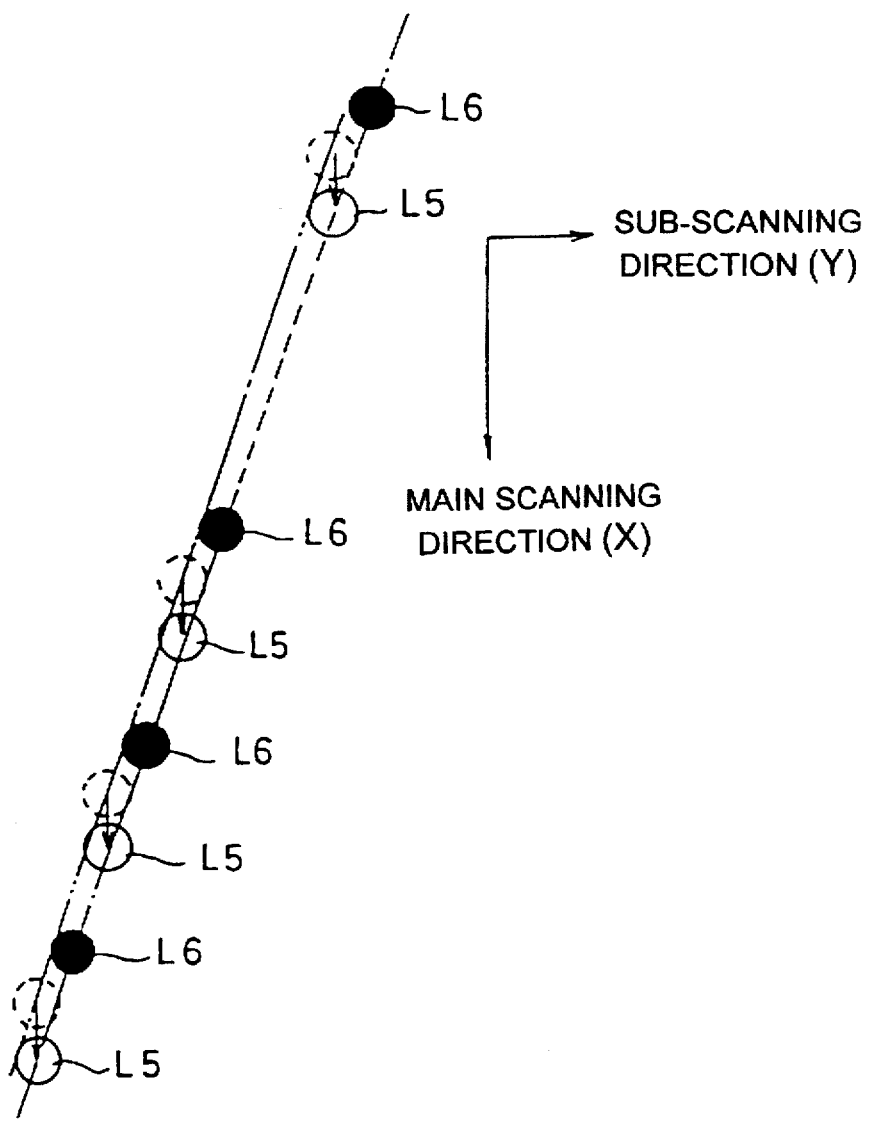
FIG. 16 is an explanatory view of one of the two groups of drawing beams which is translated in a main scanning direction of the polygonal mirror.
Figure 17:
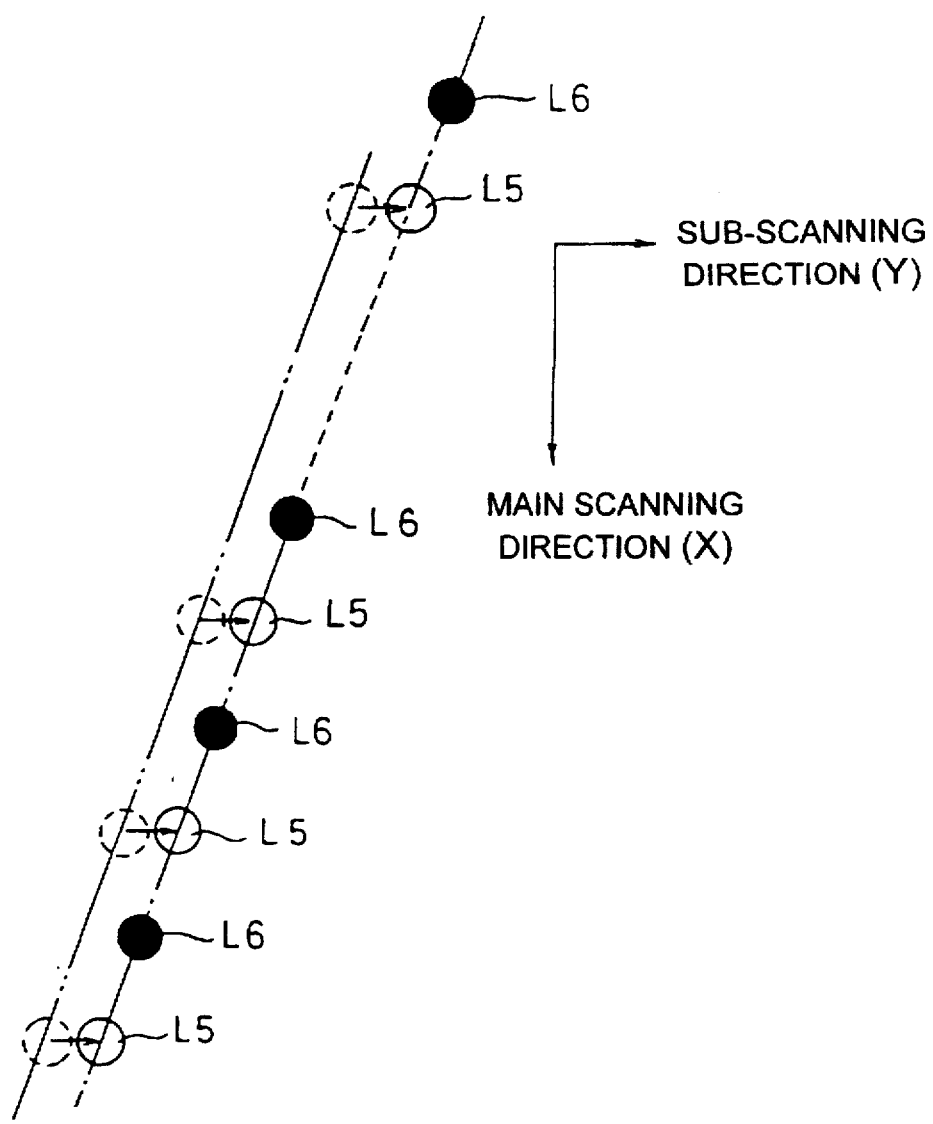
FIG. 17 is an explanatory view of one of the two groups of drawing beams which is translated in a sub-scanning direction of the polygonal mirror.

Thereafter, the X-direction adjusting mechanism 91 is actuated while observing the drawn image detected by the detector 9. Consequently, the pitch changing convergent optical systems 26 and 31 are appropriately moved in the direction X (i.e., main scanning direction of the polygonal mirror 46) to move only the drawing beams L5 in the direction X incident upon the drawing table surface at an oblique incident angle (FIG. 16). Furthermore, the micrometer head 89 of the Y-direction adjusting mechanism 85 is actuated to move the polarization beam splitter 40 in the direction Y to thereby move the drawing beams L5 in the direction Y (i.e., sub-scanning direction of the polygonal mirror 46), whereby the beam spots of the drawing beams L5 and L6 are aligned at a predetermined pitch (FIG. 17). Note that the adjustment by the swing adjusting mechanism 79, the X-direction adjusting mechanism 91 and the Y-direction adjusting mechanism 85 can be carried out in a sequential order different from that mentioned above.

As can be understood from the foregoing, according to the present invention, since an exposing and printing photomask is not necessary, it is not necessary to examine or inspect the photomask, resulting in a decreased number of manufacturing steps and a curtailed manufacturing time of the laser drawing apparatus. Moreover, the drawing speed can be extremely increased.

Although the invention has been described with reference to particular means, materials and embodiments, it is to be understood that the invention is not limited to the particulars disclosed and extends to all equivalents within the scope of the claims.

We claim:

1. A laser drawing apparatus comprising:
   a first beam splitting means for splitting laser light emitted from a laser source into a plurality of beams;
   a second beam splitting means comprising a plurality of sequential optical elements with adjacent oblique optical surfaces for partly reflecting and partly transmitting through said second beam splitting means said beams split by said first beam splitting means to split said beam split by said first beam splitting means into a plurality of groups of drawing beams;
   optical modulators providing separate ON/OFF drawing data to said respective split drawing beams transmit through said second splitting means;
   a beam combining means for combining said split drawing beams provided with the ON/OFF drawing data;
   a drawing surface; and
   a beam scanning means for scanning said drawing surface with said combined drawing beams to form an image on said drawing surface.

2. The laser drawing apparatus of claim 1, wherein said beams split by said first beam splitting means include monitoring light running parallel with said drawing beams split by said second beam splitting means.

3. The laser drawing apparatus of claim 1, wherein said second beam splitting means comprises a pair of beam splitters which split and align said beams split by said first splitting means to obtain a plurality of drawing beams that are contained in a common plane.

4. The laser drawing apparatus of claim 3, wherein said beam combining means combines said pair of beams that have been split and aligned by said second beam splitters to alternate along a line.

5. The laser drawing apparatus of claim 3, wherein each of said optical modulators is provided with a plurality of channels aligned to receive said split drawing beams contained in said common plane.

6. The laser drawing apparatus of claim 1, wherein said second beam splitting means comprises at least one beam separator which separates beams split by said first beam splitting means into a plurality of groups of drawing beams, said groups of drawing beams being aligned in said common plane.

7. The laser drawing apparatus of claim 6, wherein said beam separator is made of a plurality of optical elements adhered through separating surfaces, so that said beams incident on said separating surfaces are reflected by or transmitted through said separating surfaces to obtain said split beams.

8. The laser drawing apparatus of claim 1, wherein said plurality of groups of drawing beams comprises two groups of drawing beams and wherein said beam combining means comprises a polarization beam splitter which combines said two groups of drawing beams in a plane, one of said two groups of drawing beams being passed through said polarization beam splitter and other of said two groups of drawing beams being reflected by said polarization beam splitter, and means for moving said polarization beam splitter in a direction normal to one of said groups of drawing beams which pass said polarization beam splitter so that said two groups of drawing beams align in a plane.

9. The laser drawing apparatus of claim 1, wherein said scanning means comprises a rotatable polygonal mirror having a plurality of reflecting surfaces, so that when said polygonal mirror rotates, the drawing beams reflected by said reflecting surfaces are aligned to move in a main scanning direction to scan said drawing surface.

10. A laser drawing apparatus comprising:
a first beam splitting means for splitting laser light emitted from a laser source into a plurality of beams;
a second beam splitting means for partly reflecting and partly transmitting through said second beam splitting means said beams split by said first beam splitting means to split said beam split by said first beam splitting means into a plurality of groups of drawing beams;
optical modulators providing separate ON/OFF drawing data to said respective split drawing beams transmitted through said second splitting means;
a beam combining means for combining said split drawing beams provided with the ON/OFF drawing data;
a drawing surface;
a beam scanning means for scanning said drawing surface with said combined drawing beams to form an image on said drawing surface;
wherein said second beam splitting means comprises at least one beam separator which separates beams split by said first beam splitting means into a plurality of groups of drawing beams, said groups of drawing beams being aligned in a common plane; and
wherein said beam separator is swingably supported by an adjusting means about an axis extending parallel to said drawing beams in said common plane.

11. The laser drawing apparatus of claim 10, wherein said adjusting means comprises a rotating shaft rotatably supporting said beam separator about said axis extending parallel to said drawing beams in said common plane, and a swing adjusting mechanism having a micrometer head which presses said beam separator to rotate said beam separator about said rotating shaft.

12. A laser drawing apparatus comprising:
a first beam splitting means for splitting laser light emitted from a laser source into a plurality of beams;
a second beam splitting means for partly reflecting and partly transmitting through said second beam splitting means said beams split by said first beam splitting means to split said beam split by said first beam splitting means into two groups of drawing beams;
optical modulators providing separate ON/OFF drawing data to said respective split drawing beams transmitted through said second splitting means;
a beam combining means for combining said split drawing beams provided with the ON/OFF drawing data;
a drawing surface; and
a beam scanning means for scanning said drawing surface with said combined drawing beams to form an image in said drawing surface;
wherein said beam combining means comprises a polarization beam splitter which combines said two groups of drawing beams in a plane, one of said two groups of drawing beams being passed through said polarization beam splitter and the other of said two groups of drawing beams being reflected by said polarization beam splitter, and means for moving said polarization beam splitter in a direction normal to one of said groups of drawing beams which pass said polarization beam splitter so that said two groups of drawing beams align in a plane;
said beam combining means further comprising a base portion secured to a table of said laser drawing apparatus, a movable portion which supports said polarization beam splitter, and micrometer head means for changing a position of the movable portion in a direction normal to one said groups of drawing beams which passed through said polarization beam splitter.

13. A laser drawing apparatus comprising:
a first beam splitting means for splitting laser light emitted from a laser source into a plurality of beams;
a second beam splitting means for splitting said beams split by the first splitting means into a plurality of groups of drawing beams;
a beam combining means comprising a polarization beam splitter for combining said groups of drawing beams that have been split and aligned by said second beam splitting means so that said drawing beams are arranged in an alternating sequence along a line;
a drawing surface; and
a beam scanning means for scanning said drawing surface with said combined drawing beams to form an image on said drawing surface.

14. The laser drawing apparatus of claim 13, wherein said beams split by said first beam splitting means include monitoring light running parallel with said drawing beams split by said second beam splitting means.

15. The laser drawing apparatus of claim 13, wherein said second beam splitting means comprises a pair of beam splitters which split and align said beams split by said first splitting means to obtain a plurality of drawing beams that are contained in a common plane.

16. The laser drawing apparatus of claim 15, wherein said beam combining means combines said plurality of drawing beams that have been split and aligned by said second beam splitters along a line.

17. The laser drawing apparatus of claim 15, wherein each of said optical modulators is provided with a plurality of channels aligned to receive said split drawing beams contained in said common plane.

18. The laser drawing apparatus of claim 13, wherein said second beam splitting means comprises at least one beam separator which separates beams split by said first beam splitting means into a plurality of groups of drawing beams, said groups of drawing beams being aligned in said common plane.

19. The laser drawing apparatus of claim 13, wherein said plurality of groups of drawing beams comprises two groups of drawing beams and said beam combining means combines said two groups of drawing beams in a plane, one of said two groups of drawing beams being passed through said polarization beam splitter and the other of said two groups of drawing beams being reflected by said polarization beam splitter, and means for moving said polarization beam splitter in a direction normal to one of said groups of drawing beams which pass said polarization beam splitter so that said two groups of drawing beams align in a plane.

20. The laser drawing apparatus of claim 19, wherein said beam combining means comprises a base portion secured to a table of said laser drawing apparatus, a movable portion which supports said polarization beam splitter, and micrometer head means for changing a position of the movable portion in a direction normal to one of said groups of drawing beams which passed through said polarization beam splitter.

21. The laser drawing apparatus of claim 13, wherein said scanning means comprises a rotatable polygonal mirror having a plurality of reflecting surfaces, so that when said polygonal mirror rotates, the drawing beams reflected by said reflecting surfaces are aligned to move in a main scanning direction to scan said drawing surface.

22. A laser drawing apparatus comprising:

a first beam splitting means for splitting laser light emitted from a laser source into a plurality of beams;

a second beam splitting means for splitting said beams split by the first splitting means into a plurality of groups of drawing beams, said second beam splitting means comprising at least one beam separator which separates beams split by said first beam splitting means into a plurality of groups of drawing beams, said groups of drawing beams being aligned in a common plane, said beam separator being swingably supported by an adjusting means about an axis extending parallel to said drawing beams in said common plane;

a beam combining means comprising a polarization beam splitter for combining said split drawing beams that have been split and aligned by said second beam splitters so that said beams are arranged in an alternating manner along a line;

a drawing surface; and a beam scanning means for scanning said drawing surface with said combined drawing beams to form an image on said drawing surface.

23. The laser drawing apparatus of claim 22, wherein said adjusting means comprises a rotating shaft rotatably supporting said beam separator about said axis extending parallel to said drawing beams in said common plane, and a swing adjusting mechanism having a micrometer head which presses said rotating separator to rotate said beam separator about said rotating shaft.

24. A laser drawing apparatus comprising:

a first beam splitting means for splitting laser light emitted from a laser source into a plurality of beams;

a second beam splitting means for splitting said beams split by the first splitting means into a plurality of groups of drawing beams, said second beam splitting means comprising at least one beam separator which separates beams split by said first beam splitting means into a plurality of groups of drawing beams, said groups of drawing beams being aligned in a common plane, said beam separator being made of a plurality of optical elements adhered through separating surfaces, so that said beams incident on said separating surfaces are reflected by or transmitted through said separating surfaces to obtain said split beams;

a beam combining means comprising a polarization beam splitter for combining said split drawing beams that have been split and aligned by said second beam splitters so that said beams are arranged in an alternating manner along a line;

a drawing surface; and a beam scanning means for scanning said drawing surface with said combined drawing beams to form an image on said drawing surface.

* * * * *